United States Patent
Yamazaki

(10) Patent No.: US 7,422,935 B2
(45) Date of Patent: Sep. 9, 2008

(54) METHOD FOR MANUFACTURING SEMICONDUCTOR DEVICE, AND SEMICONDUCTOR DEVICE AND ELECTRONIC DEVICE

(75) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 422 days.

(21) Appl. No.: 11/227,228

(22) Filed: Sep. 16, 2005

(65) Prior Publication Data

US 2006/0068536 A1 Mar. 30, 2006

(30) Foreign Application Priority Data

Sep. 24, 2004 (JP) ............................ 2004-277533

(51) Int. Cl.
*H01L 21/84* (2006.01)
(52) U.S. Cl. ............................... 438/154; 257/E21.413
(58) Field of Classification Search ................ 438/153, 438/154, 163; 257/E21.413
See application file for complete search history.

(56) References Cited

U.S. PATENT DOCUMENTS

| | | | |
|---|---|---|---|
| 5,166,556 A | 11/1992 | Hsu et al. | |
| 5,581,385 A | 12/1996 | Spitzer et al. | |
| 5,757,456 A | 5/1998 | Yamazaki et al. | |
| 5,766,977 A * | 6/1998 | Yamazaki | 438/151 |
| 6,022,792 A | 2/2000 | Ishii et al. | |
| 6,118,502 A | 9/2000 | Yamazaki et al. | |
| 6,197,702 B1 * | 3/2001 | Tanabe et al. | 438/773 |
| 6,682,963 B2 | 1/2004 | Ishikawa | |
| 7,070,207 B2 | 7/2006 | Asai | |
| 2001/0015256 A1 | 8/2001 | Yamazaki et al. | |
| 2001/0053559 A1 | 12/2001 | Nagao et al. | |
| 2002/0030189 A1 | 3/2002 | Ishikawa | |
| 2003/0022403 A1 | 1/2003 | Shimoda et al. | |

(Continued)

FOREIGN PATENT DOCUMENTS

EP 1 193 759 4/2002

(Continued)

OTHER PUBLICATIONS

Nikkei Electronics, "*Sense of Crisis" is a trigger. Ignited evolution of a sesame-grain sized chip*, Leading Trends, Nov. 18, 2002, pp. 67-76.

(Continued)

*Primary Examiner*—Chandra Chaudhari
(74) *Attorney, Agent, or Firm*—Eric J. Robinson; Robinson Intellectual Property Law Office, P.C.

(57) ABSTRACT

It is an object of the present invention to manufacture a semiconductor device easily and to provide a semiconductor device whose cost is reduced. According to the present invention, a thin film integrated circuit provided over a base insulating layer can be prevented from scattering by providing a region where a substrate and the base insulating layer are attached firmly after removing a peeling layer. Therefore, a semiconductor device including a thin film integrated circuit can be manufactured easily. In addition, since a semiconductor device is manufactured by using a substrate except a silicon substrate according to the invention, a large number of semiconductor devices can be manufactured at a time and a semiconductor device whose cost is reduced can be provided.

17 Claims, 21 Drawing Sheets

U.S. PATENT DOCUMENTS

| | | |
|---|---|---|
| 2005/0023525 A1 | 2/2005 | Ishikawa |
| 2005/0070038 A1 | 3/2005 | Yamazaki et al. |
| 2005/0148121 A1 | 7/2005 | Yamazaki et al. |

FOREIGN PATENT DOCUMENTS

| | | |
|---|---|---|
| JP | 08-254686 | 10/1996 |
| JP | 2001-272923 | 10/2001 |
| JP | 2003-203898 | 7/2003 |
| WO | WO 03/010825 | 2/2003 |
| WO | WO 2005/057658 | 6/2005 |

OTHER PUBLICATIONS

Search Report (Patent Cooperation Treaty Application No. PCT/JP2004/018978) dated Mar. 15, 2005.

Search Report (Patent Cooperation Treaty Application No. PCT/JP2005/001541) dated Mar. 22, 2005.

Written Opinion (Patent Cooperation Treaty Application No. PCT/JP2005/001541) dated Mar. 22, 2005.

* cited by examiner 123　124　125

130　131　132　133　134　135

136　137　138　139　140

142

141

142

136   139

142

100

101  102  100  103  142

301

301   302

215

215

METHOD FOR MANUFACTURING SEMICONDUCTOR DEVICE, AND SEMICONDUCTOR DEVICE AND ELECTRONIC DEVICE

BACKGROUND OF THE INVENTION

1. Field of the Invention

The present invention relates to a method for manufacturing a semiconductor device, and a semiconductor device and an electronic device.

2. Description of the Related Art

In recent years, technology development of displacing a thin film integrated circuit provided over an insulating substrate has been advanced. As such technology, for example, there is a technology in which a peeling layer is provided between a thin film integrated circuit and a substrate, and the peeling layer is removed by using gas containing halogen, thereby separating the thin film integrated circuit from a supporting substrate and then displacing (see Reference 1: Japanese Patent Laid Open No.: H8-254686).

In addition, a semiconductor device that transmits and receives data by wireless has been developed actively. A semiconductor device that transmits and receives data is referred to as a wireless chip, an IC chip, an RF tag, a wireless tag, an electronic tag, a wireless processor, a wireless memory, or the like. A semiconductor device that transmits and receives data using a silicon substrate is mainly used among the semiconductor devices that are in practical use at present.

SUMMARY OF THE INVENTION

According to the above Reference 1, a peeling layer is formed over one surface of a substrate, a thin film integrated circuit is formed over the peeling layer, and the peeling layer is removed subsequently. Accordingly, the thin film integrated circuit is peeled from the substrate and there is interspace between the substrate and the thin film integrated circuit. Thereafter, the thin film integrated circuit is attached to a base material. However, since the thin film integrated circuit is thin to be approximately several μm and extremely light, the thin film integrated circuit may scatter from the substrate before attaching the thin film integrated circuit to the base material. Thus, it is an object of the present invention to manufacture a semiconductor device including a thin film integrated circuit easily.

On the occasion of trying to prevail a semiconductor device functioning as a wireless chip at low cost, it is difficult to reduce the cost because a silicon substrate is expensive. In addition, a commercial silicon substrate is circular, diameter of which is approximately 30 cm at most. Therefore, the mass production is difficult; thus, it is difficult to reduce the cost of a semiconductor device. Accordingly, it is an object of the invention to provide a semiconductor device whose cost is reduced by enabling the mass production.

According to the invention, after forming a peeling layer over one surface of a first substrate, the peeling layer is removed selectively to form a first region where the peeling layer is provided and a second region where the peeling layer is not provided. Subsequently, a base insulating layer is formed over the entire surface of the peeling layer. Accordingly, the base insulating layer is in contact with the peeling layer in the first region and in contact with the substrate in the second region.

Then, a thin film integrated circuit including a plurality of thin film transistors is formed over the base insulating layer. Subsequently, an opening is formed and thereafter the peeling layer is removed by introducing etchant to the opening. In this case, there is interspace between the substrate and the base insulating layer in the first region where the peeling layer is provided, whereas the substrate and the base insulating layer are remained attached firmly in the second region where the peeling layer is not provided. Since the region where the first substrate and the base insulating layer are attached firmly is provided in this manner even after removing the peeling layer, the thin film integrated circuit provided over the base insulating layer can be prevented from scattering.

After removing the peeling layer, a base material corresponding to a film or the like is provided over the thin film integrated circuit to integrate the thin film integrated circuit and the base material. Next, the thin film integrated circuit and the base material are peeled from the first substrate, and in this case, a bottom surface of a conductive layer for external connection is made to expose. Then, the thin film integrated circuit and a second substrate are attached so that a conductive layer over the second substrate is in contact with the conductive layer for connection of the thin film integrated circuit.

According to one feature of the invention, a method for manufacturing a semiconductor device comprises the steps of: forming a peeling layer selectively over a first substrate; forming a base insulating layer (also referred to as a first insulating layer) so that it is in contact with the first substrate and the peeling layer; forming a thin film transistor including at least source and drain regions over the base insulating layer; forming an interlayer insulating film over the thin film transistor (also referred to as a second insulating layer); forming a first opening in the first and second insulating layers so that part of the first substrate is exposed; forming a second opening in the second insulating layer so that the source or drain region of the thin film transistor is exposed; forming a first conductive layer over the second insulating layer so that the first opening and the second opening are filled; peeling a stacked body including the thin film transistor from the first substrate; and attaching the stacked body including the thin film transistor to a second substrate so that the first conductive layer is in contact with a second conductive layer provided over the second substrate.

According to one feature of the invention, a method for manufacturing a semiconductor device comprises the steps of: forming a peeling layer selectively over a first substrate; forming a base insulating layer (also referred to as a first insulating layer) so that it is in contact with the first substrate and the peeling layer; forming a thin film transistor including at least source and drain regions over the base insulating layer; forming an interlayer insulating film over the thin film transistor (also referred to as a second insulating layer); forming a first opening in the first and second insulating layers so that part of the first substrate is exposed; forming a second opening in the second insulating layer so that the source or drain region of the thin film transistor is exposed; forming a first conductive layer over the second insulating layer so that the first opening and the second opening are filled; forming a third opening in the first and second insulating layers so that the peeling layer is exposed; removing the peeling layer by introducing etchant to the third opening; peeling a stacked body including the thin film transistor from the first substrate; and attaching the stacked body including the thin film transistor to a second substrate so that the first conductive layer is in contact with a second conductive layer provided over the second substrate.

According to another feature of the invention, a method for manufacturing a semiconductor device comprises the steps of: forming a peeling layer selectively over a first substrate; forming a base insulating layer (also referred to as a first insulating layer) so that it is in contact with the first substrate and the peeling layer; forming a thin film transistor including at least source and drain regions over the base insulating layer; forming an interlayer insulating film over the thin film transistor (also referred to as a second insulating layer); forming a first opening in the first and second insulating layers so that part of the first substrate is exposed; forming a second opening in the second insulating layer so that the source or drain region of the thin film transistor is exposed; forming a first conductive layer so that the first opening and the second opening, are filled; forming a third opening in the first and second insulating layers so that the peeling layer is exposed; removing the peeling layer selectively by introducing etchant to the third opening; peeling a stacked body including the thin film transistor from the first substrate by using a physical means; and attaching the stacked body including the thin film transistor to a second substrate so that the first conductive layer is in contact with a second conductive layer provided over the second substrate.

According to the above manufacturing method, the first substrate is a glass substrate or a quartz substrate. In addition, a layer containing tungsten or molybdenum is formed as the peeling layer. Moreover, a layer containing the oxide of tungsten or molybdenum is formed by a sputtering method in an oxygen atmosphere as the peeling layer. Further, a layer containing tungsten or molybdenum is formed as the peeling layer and a layer containing the oxide of silicon is formed thereover as the first insulating layer. Furthermore, the etchant is a gas or a liquid containing halogen fluoride.

According to another feature of the invention, a semiconductor device comprises: a first conductive layer provided over a substrate; a base insulating layer (also referred to as a first insulating layer) covering the first conductive layer; a thin film transistor provided over the base insulating layer; an interlayer insulating layer (also referred to as a second insulating layer) covering the thin film transistor; and a second conductive layer provided over the interlayer insulating layer.

In a semiconductor device having the above structure, the second conductive layer is connected to the source or drain region of the thin film transistor through an opening provided in the interlayer insulating layer and is connected to the first conductive layer through an opening provided in each of the base insulating layer and the interlayer insulating layer.

According to another feature of the invention, a semiconductor device comprises: a first conductive layer provided over a substrate; a protective insulating layer (also referred to as first insulating layer) covering the first conductive layer; a base insulating layer (also referred to as a second insulating layer) covering the protective insulating layer; a thin film transistor provided over the base insulating layer; an interlayer insulating layer (also referred to as a third insulating layer) covering the thin film transistor; and a second conductive layer provided over the interlayer insulating layer. In a semiconductor device having the above structure, the second conductive layer is connected to the source or drain region of the thin film transistor through an opening provided in the interlayer insulating layer and is connected to the first conductive layer through an opening provided in each of the protective insulating layer, the base insulating layer, and the interlayer insulating layer.

Among the above constituent of a semiconductor device according to the invention, the substrate has flexibility. In addition, the first conductive layer functions as an antenna. Moreover, the side surface of the second conductive layer is in contact with the interlayer insulating layer. Further, the thin film transistor has a channel forming region and an impurity region. Furthermore, the thin film transistor has a sidewall insulating layer.

According to another feature of the invention, a semiconductor device comprises: a thin film transistor; a first insulating layer covering the thin film transistor; and a second conductive layer provided over the first insulating layer. The second conductive layer is connected to the source or drain region of the thin film transistor through a first opening provided in the first insulating layer and is exposed through a second opening provided in the first insulating layer.

According to another feature of the invention, a semiconductor device comprises: a first conductive layer; a thin film transistor provided over the first conductive layer; a first insulating layer covering the thin film transistor; and a second conductive layer provided over the first insulating layer. The second conductive layer is connected to the source or drain region of the thin film transistor through a first opening provided in the first insulating layer and is connected to the first conductive layer through a second opening provided in the first insulating layer.

According to the invention, after removing a peeling layer, a region where a substrate and a base insulating layer are attached firmly is provided; therefore, a thin film integrated circuit provided over a base insulating layer can be prevented from scattering and a semiconductor device including a thin film integrated circuit can be manufactured easily. In addition, since a semiconductor device is manufactured by using a substrate except a silicon substrate according to the invention, a large number of semiconductor devices can be manufactured at a time and a semiconductor device whose cost is reduced can be provided.

These and other objects, features and advantages of the present invention will become more apparent upon reading of the following detailed description along with the accompanied drawings.

Figure 1A:
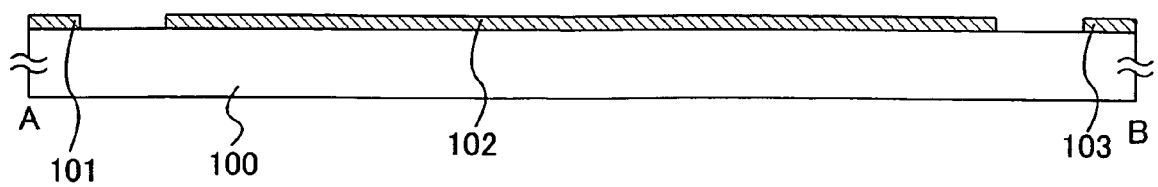
FIGS. 1A to 1C are views each explaining a method for manufacturing a semiconductor device according to a certain aspect of the present invention.

Embodiment Mode of the present invention will be described with reference to the accompanying drawings. However, it is to be easily understood that various changes and modifications will be apparent to those skilled in the art. Therefore, unless such changes and modifications depart from the invention, they should be construed as being included therein. Note that identical portions or portions having the same function in all figures for explaining embodiment modes are denoted by the same reference numerals and detailed description thereof are omitted.

Embodiment Mode 1

Figure 3A:
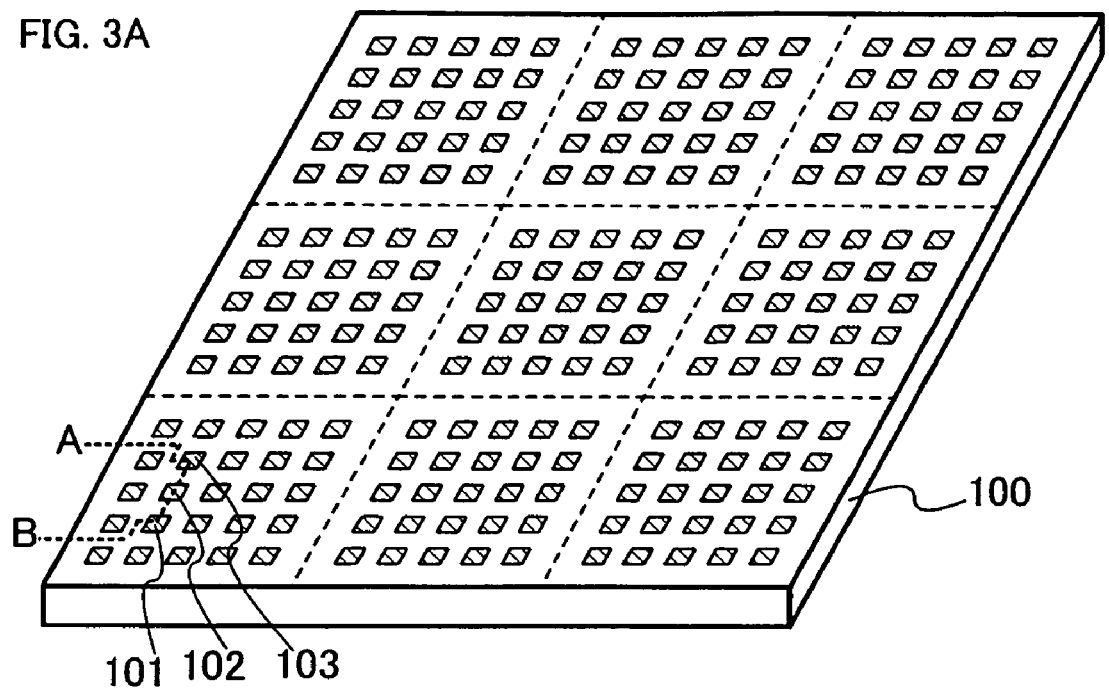
FIGS. 3A and 3B are views each explaining a method for manufacturing a semiconductor device according to a certain aspect of the present invention.

A method for manufacturing a semiconductor device of the present invention is will be explained with reference to the drawings. First, peeling layers 101 to 103 are formed in one surface of a substrate 100 (see a cross-sectional view in FIG. 1A and a perspective view in FIG. 3A; A-B in FIG. 1A corresponds to A-B in FIG. 3A). A glass substrate, a quartz substrate, a metal substrate or a stainless substrate where an insulating layer is formed in one surface, a heat-resistant plastic substrate withstanding a processing temperature of this process, or the like is used for the substrate 100. Since the size and shape of the substrate 100 like this are not limited, the productivity can be improved completely as long as a rectangular substrate whose side is 1 m or more is used, for example. As compared with the case of using a circular silicon substrate, such an advantage predominates considerably. In addition, a thin film integrated circuit provided over the substrate 100 is peeled from the substrate 100 subsequently. Therefore, a new thin film integrated circuit may be formed over the substrate 100 by reusing the substrate 100 again. Thus, the cost can be reduced. Note that a quartz substrate is preferable as the substrate 100 that is reused.

After forming a thin film in one surface of the substrate 100, the thin film is patterned by a photolithography method to form the peeling layers 101 selectively. The peeling layers 101 to 103 is formed by a known means (a sputtering method, a plasma CVD method, or the like) in a single layer or stacked layers of a layer formed from an element of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), or an alloy material or a compound material containing the element as the main component. The crystalline structure of a layer containing silicon may be any one of an amorphous state, a microcrystalline state, or a polycrystalline state.

When the peeling layers 101 to 103 have a single layer structure, it is preferable to form a tungsten layer, a molybdenum layer, or a layer containing mixture of tungsten and molybdenum. Alternatively, a layer containing the oxide or oxynitride of tungsten, a layer containing the oxide or oxynitride of molybdenum, or a layer containing the oxide or oxynitride of mixture of tungsten and molybdenum is formed. Note that the mixture of tungsten and molybdenum corresponds to an alloy of tungsten and molybdenum, for example.

When the peeling layers 101 to 103 have a stacked layer structure, it is preferable to form a tungsten layer, a molybdenum layer, or a layer containing mixture of tungsten and molybdenum as the first layer and to form the oxide, nitride, oxynitride, or nitride oxide of tungsten, molybdenum, or mixture of tungsten and molybdenum as the second layer.

When the peeling layers 101 to 103 are formed to have a stacked layer structure of a layer containing tungsten and a layer containing the oxide of tungsten, it may be utilized that a layer containing the oxide of tungsten is formed in an interface between a tungsten layer and a silicon oxide layer by forming a layer containing tungsten and a layer containing silicon oxide thereover. This is the same in the case of forming a layer containing the nitride, oxynitride, and nitride oxide of tungsten. It is desirable to form a layer containing tungsten and then to form a silicon nitride layer, a silicon oxynitride layer, or a silicon nitride oxide layer thereover.

The oxide of tungsten is represented by $WO_x$, in which x ranges from 2 to 3. Specifically speaking the value of x, there is a case where x is 2 ($WO_2$), 2.5 ($W_2O_5$), 2.75 ($W_4O_{11}$), 3 ($WO_3$), or the like. In forming the oxide of tungsten, the above x values are not limited particularly and it is desirable to decide the value depending on the etching rate. However, it is a layer containing the oxide of tungsten ($WO_x$; $0<x<3$) which is formed by a sputtering method in an oxygen atmosphere that has the most desirable etching rate. Therefore, in order to shorten the manufacturing time, it is preferable to form a layer containing the oxide of tungsten by a sputtering method in an oxygen atmosphere as the peeling layer.

Although the peeling layers 101 to 103 are formed so as to be in contact with the substrate 100 according to the above process, the invention is not limited to this process. An insulating layer to be a base may be formed so as to be in contact with the substrate 100, and the peeling layers 101 to 103 may be formed so as to be in contact with the insulating layer.

Figure 1B:
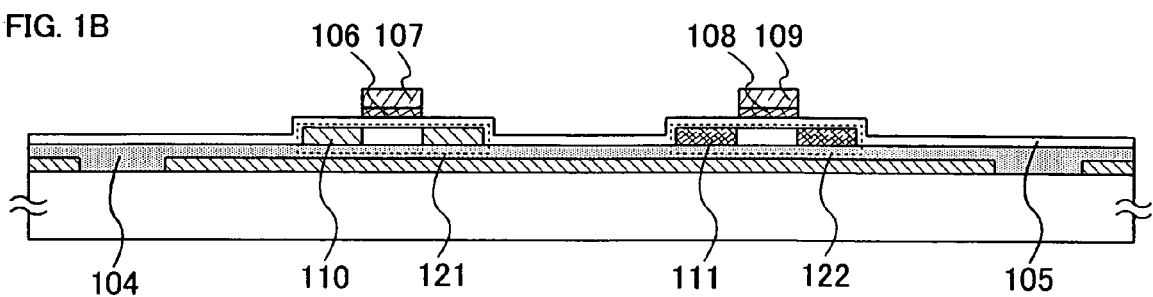

Then, a base insulating layer 104 to be a base is formed so as to cover the peeling layers 101 to 103 (see FIG. 1B). The base insulating layer 104 is in contact with the substrate 100 in the region where the peeling layers 101 to 103 are not provided and in contact with the peeling layers 101 to 103 in other regions. The base insulating layer 104 is formed in a single layer or stacked layers of a layer containing the oxide of silicon or the nitride of silicon by a known means (a sputtering method, a plasma CVD method, or the like). The oxide material of silicon is a material containing silicon (Si) and oxygen (O), which corresponds to silicon oxide, silicon oxynitride, silicon nitride oxide, or the like. The nitride material of silicon is a material containing silicon and nitrogen (N), which corresponds to silicon nitride, silicon oxynitride, silicon nitride oxide, or the like.

When the base insulating layer 104 has a two-layer structure, for example, it is desirable to form a silicon nitride oxide layer as the first layer and a silicon oxynitride layer as the second layer. When the base insulating layer 104 has a three-layer structure, it is desirable to form a silicon oxide layer as a first insulating layer, a silicon nitride oxide layer as a second insulating layer, and a silicon oxynitride layer as a third insulating layer. Alternatively, it is desirable to form a silicon oxynitride layer as the first insulating layer, a silicon nitride oxide layer as the second insulating layer, and a silicon oxynitride layer as the third insulating layer. The base insulating layer 104 functions as a blocking film that prevents the entry of impurities from the substrate 100.

Then, an amorphous semiconductor layer (for example, a layer containing amorphous silicon) is formed over the base insulating layer 104. This amorphous semiconductor layer is formed in a thickness of 25 nm to 200 nm (preferably, 30 nm to 150 nm) by a known means (a sputtering method, an LPCVD method, a plasma CVD method, or the like). Subsequently, the amorphous semiconductor layer is crystallized by a known crystallization method (a laser crystallization method, a thermal crystallization method using RTA or an annealing furnace, a thermal crystallization method using a metal element promoting crystallization, a method in which the thermal crystallization method using a metal element promoting crystallization and the laser crystallization method are combined, or the like) to form a crystalline semiconductor layer. Thereafter, the obtained crystalline semiconductor layer is patterned into a desired shape to form crystalline semiconductor layers 121 and 122.

A specific example of the manufacturing process of the crystalline semiconductor layers 121 and 122 is as follows. First, an amorphous semiconductor layer in 66 nm thick is formed by using a plasma CVD method. Then, after a solution containing nickel that is a metal element promoting crystallization is kept over the amorphous semiconductor layer, dehydrogenation treatment (at 500° C. for one hour) and thermal crystallization treatment (at 550° C. for 4 hours) are performed to the amorphous semiconductor layer to form a crystalline semiconductor layer. Thereafter, the crystalline semiconductor layers 121 and 122 are formed by performing laser beam irradiation, if necessary, and performing patterning treatment using a photolithography method.

Note that a continuous-oscillation or pulsed-oscillation gas laser or solid laser is used in the case of forming the crystalline semiconductor layers 121 and 122 by a laser crystallization method. The following laser can be used as the gas laser: an excimer laser, a YAG laser, a $YVO_4$ laser, a YLF laser, $YAlO_3$ laser, a glass laser, a ruby laser, a Ti: sapphire laser, or the like. On the other hand, a laser using a crystal such as YAG, $YVO_4$, YLF, or $YAlO_3$ in which Cr, Nd, Er, Ho, Ce, Co, Ti, or Tm is doped is used as the solid laser.

There are few crystal defects when a continuous wave laser is used, and as a result, a transistor can be formed by using a polycrystalline semiconductor with a large grain size. Further, since mobility and response are favorable, high-speed driving is possible and it is possible to improve an operating frequency of an element. Moreover, since there are few characteristics variations, high reliability can be obtained. A channel-length direction of a transistor and a scanning direction of laser light are preferably the same to further improve an operating frequency. This is because the highest mobility can be obtained when a channel length direction of a transistor and a scanning direction of laser light with respect to a substrate are almost parallel (preferably, from −30° to 30°) in a laser crystallization process by a continuous wave laser. Note that the channel length direction coincides with a current flowing direction, in other words, a direction in which a charge moves in a channel forming region. The transistor manufactured in this manner has an active layer including a polycrystalline semiconductor in which a crystal grain extends in a channel direction, and this means that a crystal grain boundary is formed almost along a channel direction.

In addition, a pulsed wave laser may also be used. This is because crystal grains that are sequentially grown in the scanning direction can be obtained as long as a laser beam is oscillated with such a repetition rate that the laser beam of the next pulse is emitted after melting the semiconductor film and before solidifying the semiconductor film, regardless of an energy beam (pulsed beam) that is outputted in pulse. It is desirable to use a pulsed beam with a low repetition rate limit whose pulse period is set shorter than the time from melting the semiconductor film to solidifying the semiconductor film. Specifically, the repetition rate of the pulsed laser is set 10 MHz or more, preferably 60 MHz to 100 MHz. This repetition rate band is extremely higher than that of the pulsed laser used usually, which is from several tens Hz to several hundreds Hz. It is possible to emit the laser beam of the next pulse after melting the semiconductor film and before solidifying the semiconductor film by using the above repletion rate. Therefore, since the interface between the solid phase and the liquid phase can be moved sequentially in the semiconductor film, which is different from the case of using the pulsed wave laser having the conventional repetition rate band, the semiconductor film having crystal grains that are sequentially grown in the scanning direction is formed. Further specifically, it is possible to form an aggregation of crystal grains each having a width approximately from 10 μm to 30 μm in the scanning direction and a width approximately from 1 μm to 5 μm in a direction perpendicular to the scanning direction, and thus, a crystal grain almost the same as that of a continuous wave laser can be obtained. It is also possible to form a semiconductor film having almost no crystal grain boundaries at least in the channel length direction of a thin film transistor by forming a crystal grain of a single crystal extending long in the scanning direction. The following laser capable of oscillating with the above repetition rate can be used as the pulsed laser: an Ar laser, a Kr laser, an excimer laser, a $CO_2$ laser, a YAG laser, a $Y_2O_3$ laser, $YVO_4$ laser, a YLF laser, a $YAlO_3$ laser, a glass laser, a ruby laser, an alexandrite laser, Ti: sapphire laser, a copper vapor laser, or a gold vapor laser.

In addition, when the amorphous semiconductor layer is crystallized by using a metal element promoting crystallization, it is advantageous that the crystal grows in the same direction in addition to that crystallization is possible at a low temperature within a short time, whereas it is disadvantageous that the OFF current is increased because the metal element remains in the crystalline semiconductor layers and thus the characteristic is not stabilized. Accordingly, it is desirable to form an amorphous semiconductor layer that functions as a gettering site over the crystalline semiconductor layers. Since it is necessary to make the amorphous semiconductor layer that functions as a gettering site contain an impurity element of phosphorus or argon, preferably, it is desirable to form the amorphous semiconductor layer by a sputtering method capable of having the amorphous semiconductor layer contain argon in high concentration. Thereafter, the metal element is diffused into the amorphous semiconductor layer by performing heat treatment (an RTA method, thermal annealing using an annealing furnace) and the amorphous semiconductor layer containing the metal element is removed subsequently. Accordingly, the content of the metal element in the crystalline semiconductor layers can be reduced or the metal element can be removed.

Then, a gate insulating layer 105 covering the crystalline semiconductor layers 121 and 122 is formed. The gate insulating layer 105 is formed in a single layer or stacked layers of a layer containing the oxide of silicon or the nitride of silicon by a known means (a plasma CVD method or a sputtering method). Specifically, the gate insulating layer 105 is formed in a single layer or stacked layers of a layer containing silicon oxide, a layer containing silicon oxynitride, or a layer containing silicon nitride oxide.

Next, a first conductive layer and a second conductive layer are stacked over the gate insulating layer 105. The first conductive layer is formed in a thickness of 20 nm to 100 nm by a known means (a plasma CVD method or a sputtering method). The second conductive layer is formed in a thickness of 100 nm to 400 nm by a known means. The first conductive layer and the second conductive layer are formed from an element of tantalum (Ta), tungsten (W), titanium (Ti), molybdenum (Mo), aluminum (Al), copper (Cu), chromium (Cr), niobium (Nd), and the like or an alloy material or a compound material containing the element as the main component. Alternatively, the first conductive layer and the second conductive layer are formed from a semiconductor material typified by polycrystalline silicon in which an impurity element such as phosphorus or the like is doped.

Combination examples of the first conductive layer and the second conductive layer are a stacked layer structure of a tantalum nitride (TaN; the composition ratio of tantalum and nitrogen is not limited) layer and a tungsten (W) layer over the tantalum nitride layer, a stacked layer structure of a tungsten nitride (WN; the composition ratio of tungsten and nitrogen is not limited) layer and a tungsten layer over the tungsten nitride layer, a stacked layer structure of a molybdenum nitride (MoN; the composition ratio of molybdenum and nitrogen is not limited) layer and a molybdenum (Mo) layer over the molybdenum nitride layer, or the like. Since tungsten or tantalum nitride has high heat resistance, heat treatment aimed at thermal activation can be performed after forming the first conductive layer and the second conductive layer. In addition, in the case of a three-layer structure instead of the two-layer structure, it is desirable to employ a stacked layer structure of a molybdenum layer, an aluminum layer, and a molybdenum layer.

Then, resist masks are formed by using a photolithography method and etching treatment for forming a gate electrode and a gate line is performed to form conductive layers (also referred to as a gate electrode layer) 106 to 109 each functioning as a gate electrode.

Next, an n-type impurity region 110 is formed by adding an impurity element imparting n-type conductivity into the crystalline semiconductor layer 121 by an ion dope method or an ion implantation method to form a low concentration region. It is sufficient that an element belonging to Group 15 is used for the impurity element imparting n-type conductivity and, for example, phosphorus (P) or arsenic (As) is used.

Subsequently, a p-type impurity region 111 is formed by adding an impurity element imparting p-type conductivity into the crystalline semiconductor layer 122. For example, boron (B) is used for the impurity element imparting p-type conductivity.

Then, an insulating layer is formed so as to cover the gate insulating layer 105 and the conductive layers 106 to 109. The insulating layer is formed by a known means (a plasma CVD method or a sputtering method) in a single layer or stacked layers of a layer containing an inorganic material such as silicon, the oxide of silicon, or the nitride of silicon (also referred to as an inorganic layer) or a layer containing an organic material such as organic resin (also referred to as an organic layer). Preferably, a layer containing the oxide of silicon is formed as the insulating layer.

Next, insulating layers (hereinafter referred to as a sidewall insulating layer) 112 and 113 in contact with the side surfaces of the conductive layers 106 to 109 are formed by etching the insulating layer selectively by anisotropic etching which is mainly for the vertical direction (see FIG. 1C). The sidewall insulating layers 112 and 113 are used as masks.

Note that that gate insulating layer 105 is also etched according to an etching process for forming the sidewall insulating layers 112 and 113; thus, gate insulating layers 163 and 164 are formed. The gate insulating layers 163 and 164 are layers that overlap with the conductive layers 106 to 109 and the sidewall insulating layers 112 and 113.

Figure 1C:
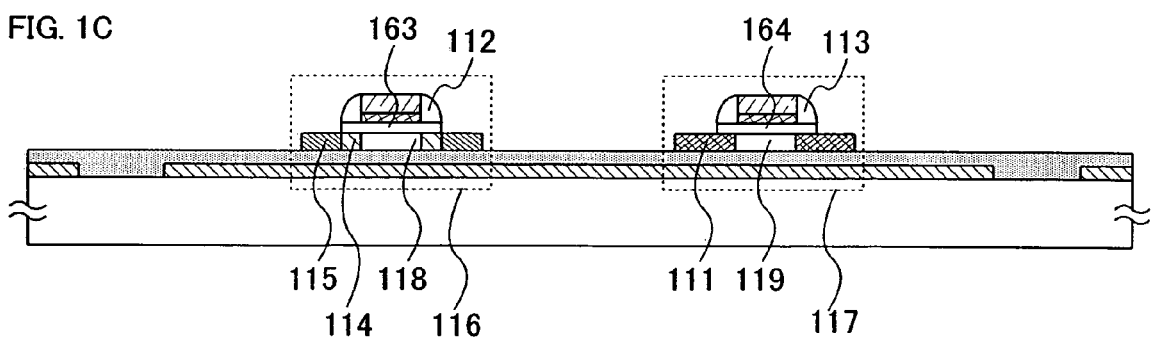

The gate insulating layer 105 is etched in this manner because the materials of the gate insulating layer 105 and the sidewall insulating layers 112 and 113 each have the same etching rate, and FIG. 1C shows the case.

Therefore, although the etching process for forming the sidewall insulating layers 112 and 113 is performed, the gate insulating layer 105 is left, when the materials of the gate insulating layer 105 and the sidewall insulating layers 112 and 113 each have different etching rates.

Then, a first n-type impurity region (also referred to as an LDD region) 114 and a second n-type impurity region 115 are formed by adding an impurity element imparting n-type conductivity into the crystalline semiconductor layer 121 by using the sidewall insulating layer 112 and the conductive layers 106 and 107 as a mask. The concentration of the impurity element contained in the first n-type impurity region 114 is lower than the concentration of the impurity element contained in the second n-type impurity region 115.

Note that it is preferable that a sidewall insulating layer is used as a mask in order to form the first n-type impurity region 114. When the method in which a sidewall insulating layer is used as a mask is employed, there is an advantage that the LDD regions can be formed certainly and the width of the LDD regions can be controlled easily.

Through the above processes, an n-type (n-channel type) thin film transistor 116 and a p-type (p-channel type) thin film transistor 117 are completed. The n-type thin film transistor 116 has an LDD structure and has an active layer including the first n-type impurity region 114 (also referred to as an LDD region), the second n-type impurity region 115, and a channel forming region 118; the gate insulating layer 163; and the conductive layers 106 and 107 that each function as a gate electrode. The p-type thin film transistor 117 has a single drain structure and has an active layer including the p-type impurity region 111 and a channel forming region 119; the gate insulating layer 164; and the conductive layers 108 and 109 that each function as a gate electrode.

Figure 2A:
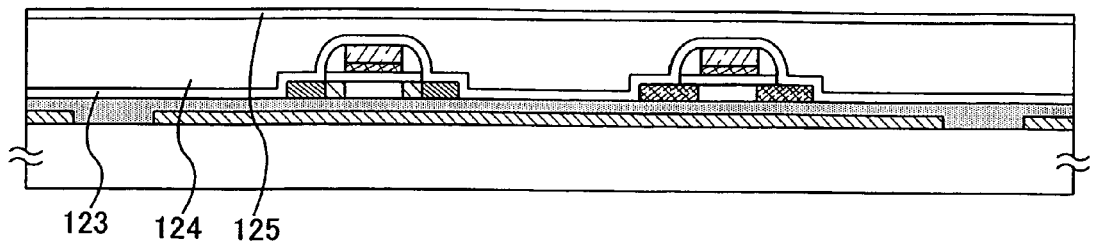
FIGS. 2A to 2C are views each explaining a method for manufacturing a semiconductor device according to a certain aspect of the present invention.

Then, an interlayer insulating layer is formed in a single layer or stacked layers so as to cover the thin film transistors 116 and 117 (see FIG. 2A). The interlayer insulating layer covering the thin film transistors 116 and 117 are formed by a known means (an SOG method, a droplet discharging method, or the like) in a single layer or stacked layers of an inorganic material such as the oxide of silicon or the nitride of silicon; an organic material such as polyimide, polyamide, benzocyclobutene, acrylic, or epoxy resin; or the like.

In addition, the interlayer insulating layer covering the thin film transistors 116 and 117 may be formed from a siloxane-based material. Siloxane is composed of a skeleton structure formed by the bond of silicon and oxygen. An organic group at least containing hydrogen (such as an alkyl group or aromatic hydrocarbon), a fluoro group, or an organic group at least containing hydrogen and a fluoro group may be used as the substituent.

A cross-sectional structure shown in FIG. 2A is the case where the interlayer insulating layer covering the thin film transistors 116 and 117 has a three-layer structure. A layer containing silicon oxide is formed as a first interlayer insulating layer 123, a layer containing resin is formed as a second interlayer insulating layer 124, and a layer containing silicon nitride is formed as a third interlayer insulating layer 125.

Note that it is desirable to perform heat treatment aimed at the recovery of the crystallinity of the semiconductor layer, the activation of the impurity element added into the semiconductor layer, or the hydrogenation of the semiconductor layer, before forming the interlayer insulating layers 123 to 125 or after forming one or a plurality of thin films among the interlayer insulating layers 123 to 125. It is desirable to apply thermal annealing, a laser annealing method, an RTA method, or the like to the heat treatment.

Figure 2B:
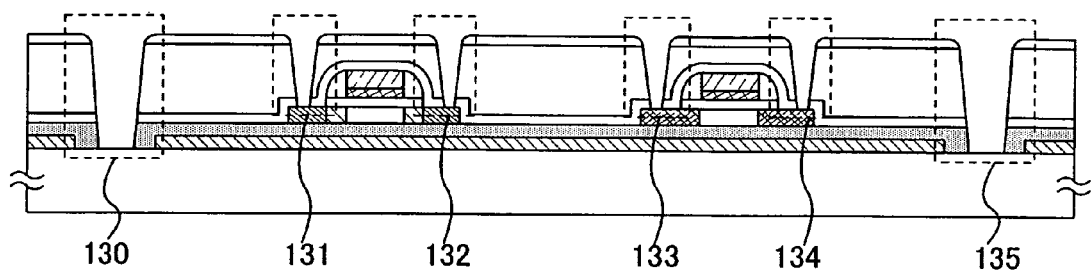

Then, openings 130 to 135 for exposing part of the substrate 100, the p-type impurity region 111, and the n-type impurity region 115 are formed by etching the interlayer insulating layers 123 to 125 by using a photolithography method (see FIG. 2B). In the process of forming these openings 130 to 135, the peeling layers 101 to 103 are made not to expose.

Although the openings 130 to 135 are formed in the same process in the above process, the invention is not limited to this process. The object to be exposed (a substrate or an impurity region) in the openings 130 and 135 is each different from that in the openings 131 to 134; therefore, the openings 130 and 135 and the openings 131 to 134 may be formed in different processes.

Figure 2C:
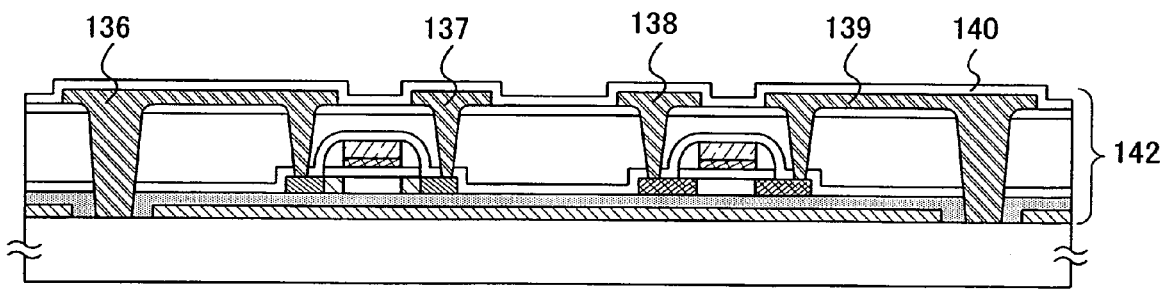

Subsequently, conductive layers are formed so as to fill the openings 130 to 135 and conductive layers 136 to 139 are formed by patterning the conductive layers (see FIG. 2C). The conductive layers 136 to 139 each function as a source or drain wiring and also function as a connection conductive layer to an external terminal.

Note that the side surfaces of the conductive layers 136 to 139 formed in this manner are not in contact with the peeling layers 101 to 103 but in contact with the interlayer insulating layers 123 to 125. This is because the conductive layers 136 to 139 are made not to remove by etchant in removing the peeling layers 101 to 103 by the etchant.

The conductive layers 136 to 139 are formed by a known means (a plasma CVD method or a sputtering method) in a single layer or stacked layers of an element of titanium (Ti), aluminum (Al), and neodymium (Nd), or an alloy material or a compound material containing the element as the main component. An alloy material containing aluminum as the main component corresponds to an alloy material containing nickel whose main component is aluminum or an alloy material containing nickel and one or both of carbon and silicon whose main component is aluminum, for example. As for the conductive layers 136 to 139, for example, it is desirable to employ a stacked layer structure of a barrier layer, an aluminum silicon (Al—Si; corresponding to aluminum in which silicon is added) layer, and a barrier layer or a stacked layer of a barrier layer, an aluminum silicon (Al—Si) layer, a titanium nitride (TiN; the composition ratio of titanium and nitrogen is not limited) layer, and a barrier layer. Note that a barrier layer corresponds to a layer formed from titanium, the nitride of titanium, molybdenum, or the nitride of molybdenum. The aluminum or aluminum silicon has a low resistance value and is inexpensive, which is an optimum material for forming the conductive layers 136 to 139. In addition, generation of a hillock of aluminum or aluminum silicon can be prevented when upper and lower barrier layers are provided. Further, preferable contact can be obtained between aluminum or aluminum silicon and the crystalline semiconductor layers when the lower barrier layer is provided. Furthermore, regardless of a thin natural oxide film formed over the crystalline semiconductor layers, this natural oxide film can be reduced and preferable contact with the crystalline semiconductor layers can be obtained, when a barrier layer of titanium is formed because titanium is an element having a high reduction property.

Figure 3B:
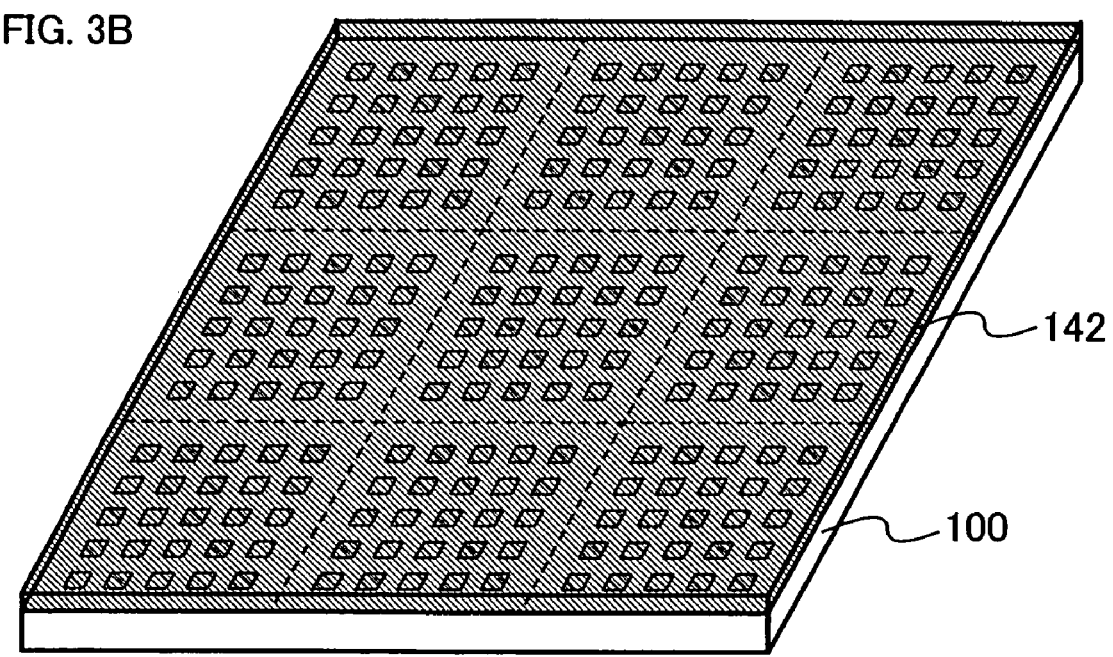

Next, an insulating layer 140 is formed so as to cover the conductive layers 136 to 139. The insulating layer 140 corresponds to a layer containing carbon such as DLC (diamond-like carbon), a layer containing silicon nitride, a layer containing silicon nitride oxide, a layer containing an organic material (preferably, an epoxy resin), or the like. Note that the insulating layer 140 functions as a protective layer and may not be formed if not necessary. In addition, when a layer formed from an organic material is formed as the insulating layer 140, a plurality of elements over the substrate 100 increases the weight even after the peeling layers 101 to 103 are removed. Therefore, the plurality of elements is prevented from scattering from the substrate 100 and does not have a coiled shape; thus, the breakdown and damage of the element can be prevented. Here, the elements including the thin film transistors 116 and 117 and the conductive layers 136 to 139 completed through the above processes are collectively referred to as a thin film integrated circuit 142 (see a cross-sectional view in FIG. 2C and a perspective view in FIG. 3B).

In other words, the thin film integrated circuit 142 corresponds to the stacked body including the thin film transistors 116 and 117.

Figure 4A:
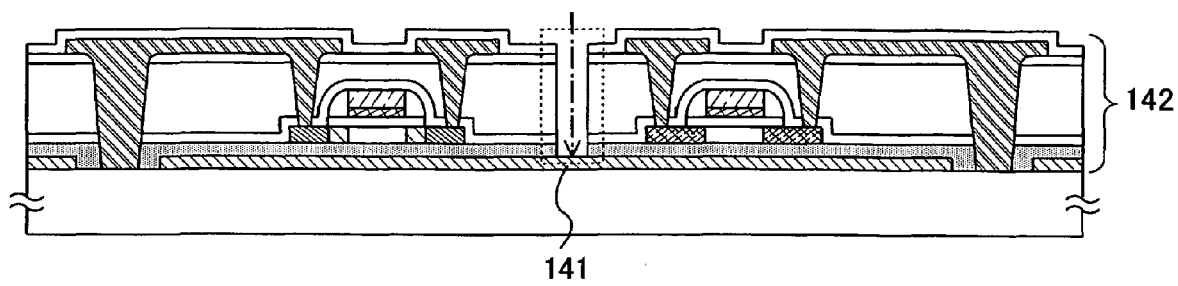
FIGS. 4A and 4B are views each explaining a method for manufacturing a semiconductor device according to a certain aspect of the present invention.
Figure 5A:
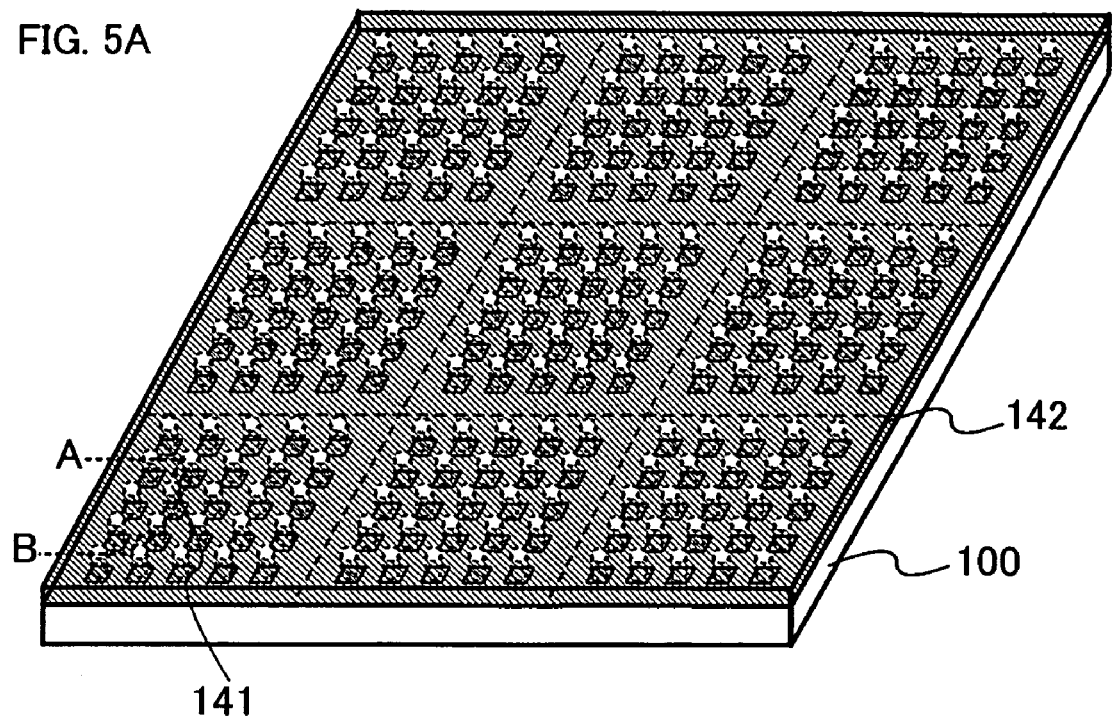
FIGS. 5A and 5B are views each explaining a method for manufacturing a semiconductor device according to a certain aspect of the present invention.

Then, an opening 141 is formed by etching the base insulating layer 104, the interlayer insulating layers 123 to 125, and the insulating layer 140 by using a photolithography method so as to expose the peeling layers 101 to 103 (see a cross-sectional view in FIG. 4A and a perspective view in FIG. 5A).

Figure 4B:
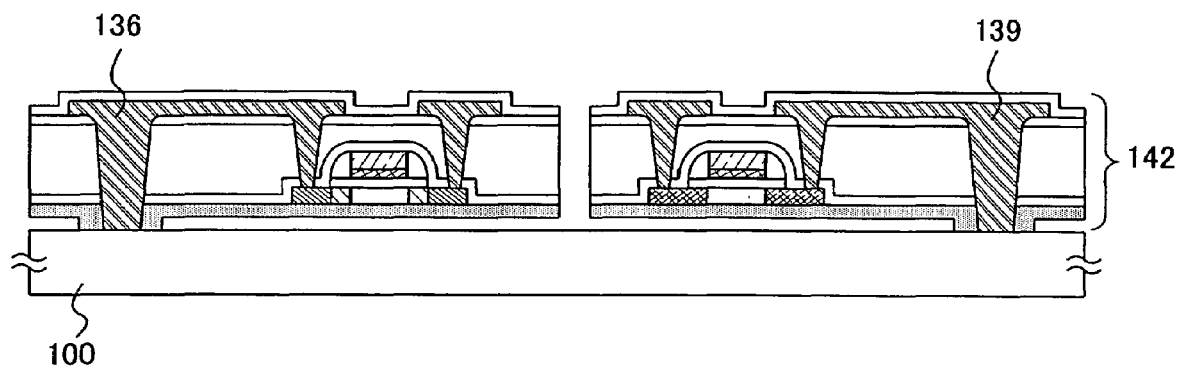
Figure 5B:
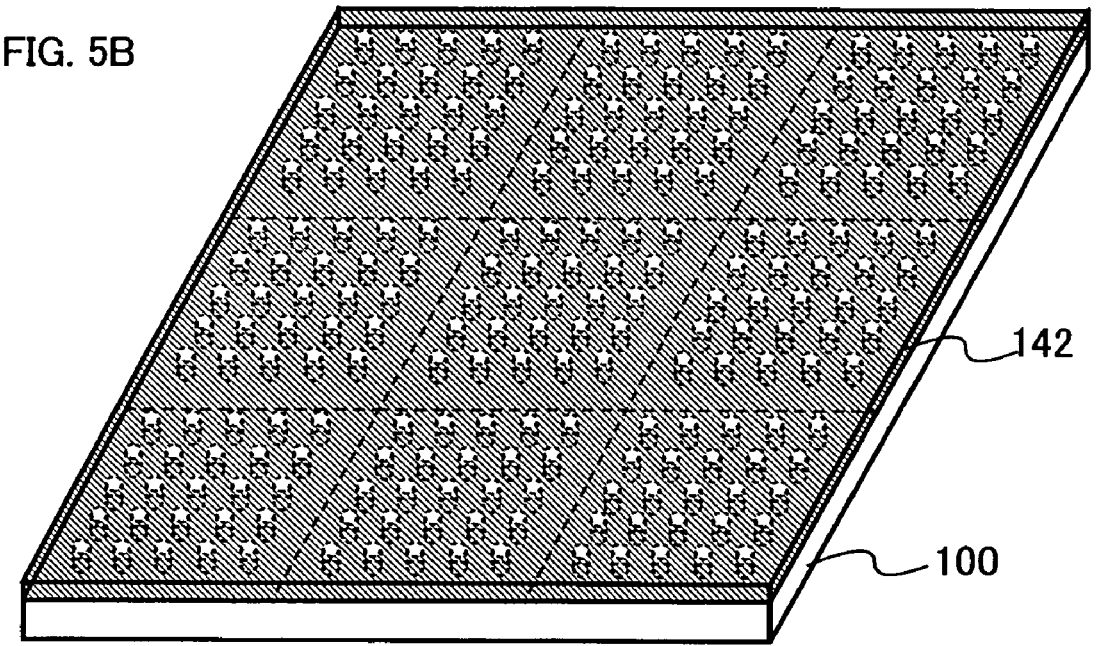

Next, the peeling layers 101 to 103 are removed by introducing etchant to the opening 141 (see a cross-sectional view in FIG. 4B and a perspective view in FIG. 5B). As for the etchant in the case of wet etching, a mixed solution in which hydrofluoric acid is diluted with water or ammonium fluoride; a mixed solution of hydrofluoric acid and nitric acid; a mixed solution of hydrofluoric acid, nitric acid, and acetic acid; a mixed solution of hydrogen peroxide and sulfuric acid; a mixed solution of hydrogen peroxide, ammonia water, and water; a mixed solution of hydrogen peroxide, hydrochloric acid, and water; or the like is used. In addition, in the case of dry etching, a gas including a halogen-based atom or molecule or a gas including oxygen is used.

Preferably, a gas or a liquid containing halogen fluoride or interhalogen compound is used for the etchant. For example, chlorine trifluoride ($ClF_3$) is used for the gas containing halogen fluoride.

In addition, nitrogen trifluoride ($NF_3$), bromine trifluoride ($BrF_3$), or hydrogen fluoride (HF) may be used as the gas or liquid containing halogen fluoride (the gas or liquid containing halide). In the case of using hydrogen fluoride (HF), a layer containing the oxide of silicon is formed as the peeling layer.

Since the conductive layers 136 and 139 are provided not to be in contact with the peeling layers 101 to 103, the conductive layers 136 and 139 are not etched by the etchant in this process.

Figure 6A:
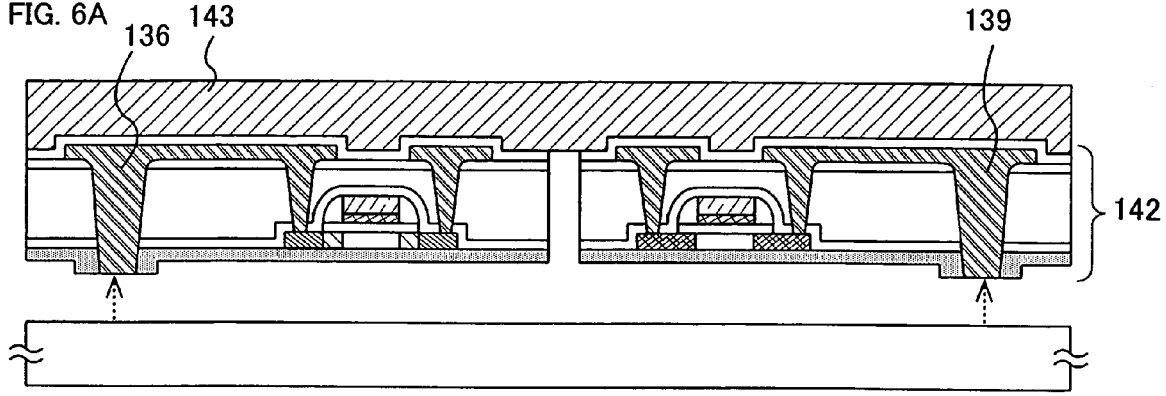
FIGS. 6A to 6C are views each explaining a method for manufacturing a semiconductor device according to a certain aspect of the present invention.
Figure 7A:
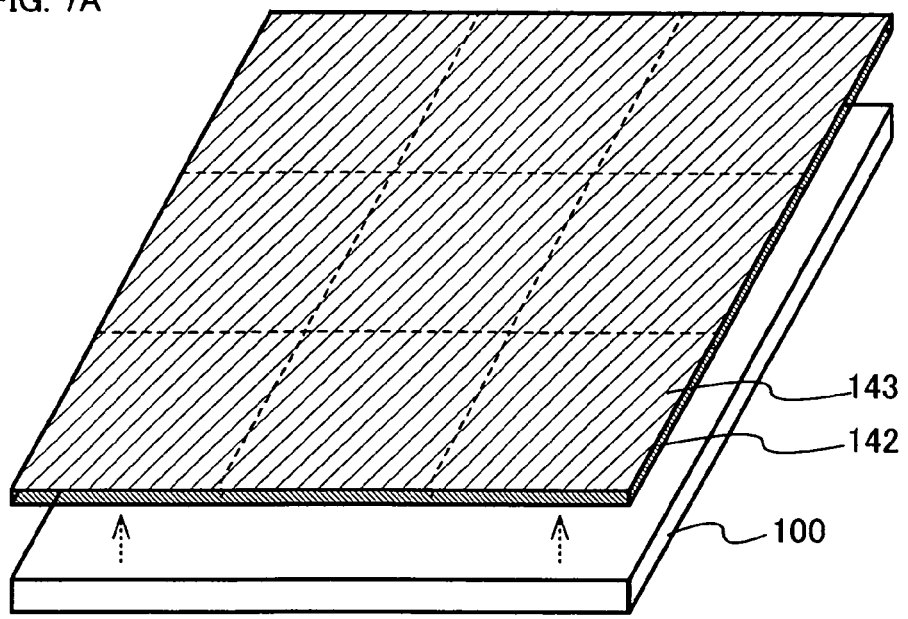
FIGS. 7A to 7D are views each explaining a method for manufacturing a semiconductor device according to a certain aspect of the present invention.

Then, after attaching one surface of the thin film integrated circuit 142 to a base material 143 and integrating the thin film integrated circuit 142 and the base material 143, the thin film integrated circuit 142 is peeled from the substrate 100 completely (see a cross-sectional view in FIG. 6A and a perspective view in FIG. 7A).

The base material 143 corresponds to a stacked film in which a laminate film (formed from polypropylene, polyester, vinyl, polyvinyl fluoride, polyvinyl chloride, or the like), paper of a fibrous material, a film in which a base film (polyester, polyamide, an inorganic vapor deposition film, a variety of paper, or the like) and an adhesive synthetic resin film (an acrylic-based synthetic resin, an epoxy-based synthetic resin, or the like) are stacked, or the like. A laminate film is formed by performing laminate treatment to the subject by thermocompression bonding. In performing a laminate treatment, an adhesive layer provided for the uppermost surface of the laminate film or a layer provided for the outermost layer (not an adhesive layer) is melted by heat treatment to adhere by applying pressure. The surface of the base material 143 may be provided with an adhesive layer or not. The adhesive layer corresponds to a layer containing an adhesive such as a thermosetting resin, an ultraviolet-curable resin, an epoxy-resin based adhesive agent, or a resin additive agent.

Figure 7B:
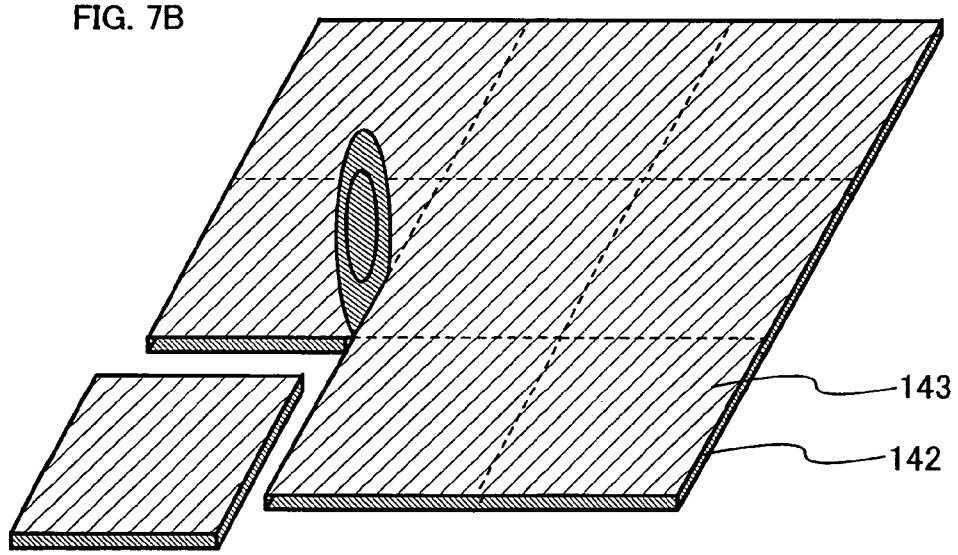

Then, the integration of the thin film integrated circuit 142 and the base material 143 is separated by using a slicing apparatus, a laser irradiation apparatus, a dicer, a wire saw, or the like (see a perspective view in FIG. 7B).

Figure 6B:
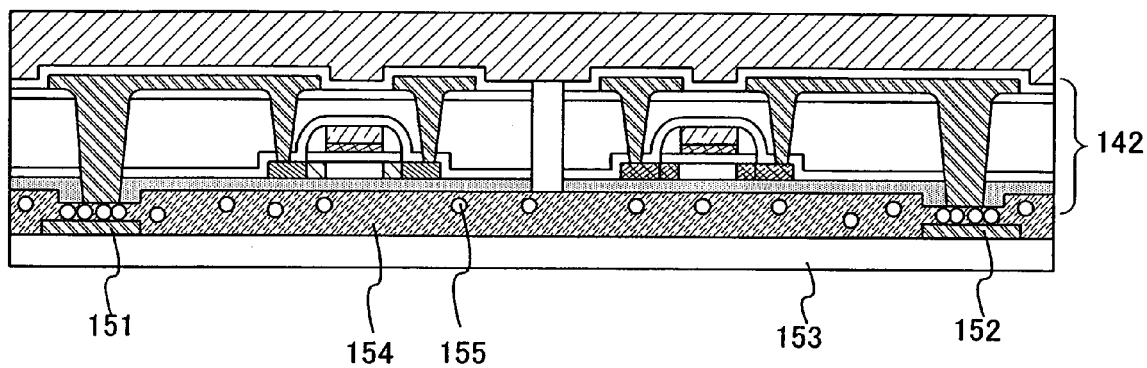
Figure 7C:
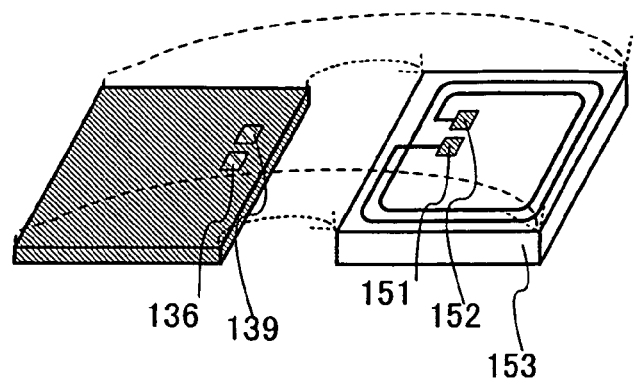
Figure 7D:
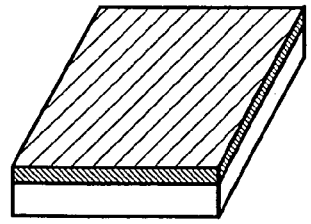

Subsequently, the other surface of the thin film integrated circuit 142 is attached to a substrate 153 provided with conductive layers 151 and 152 (see a cross-sectional view in FIG. 6B and perspective views in FIGS. 7C and 7D). In addition, the thin film integrated circuit 142 and the substrate 153 are attached by using a resin 154 containing conductive particles 155 so that the conductive layers 136 and 139 included in the thin film integrated circuit 142 and the conductive layers 151 and 152 over the substrate 153 are in contact to each other.

The resin 154 containing the conductive particles 155 corresponds to an anisotropic conductive layer.

It is preferable to use a thin and lightweight plastic substrate having flexibility for the substrate 153, and specifically, a substrate formed from PET (polyethylene terephthalate), PEN (polyethylene naphthalate), PES (polyether sulfone), polypropylene, polypropylene sulfide, polycarbonate, polyetherimide, polyphenylene sulfide, polyphenylene oxide, polysulfone, polyphthalamide, or the like can be used.

This embodiment shows the case in which the conductive layers 151 and 152 functioning as an antenna are provided over the substrate 153, and a semiconductor device functioning as a wireless chip (also referred to as a wireless processor, a wireless memory, or a wireless tag) is completed through the above processes.

Figure 6C:
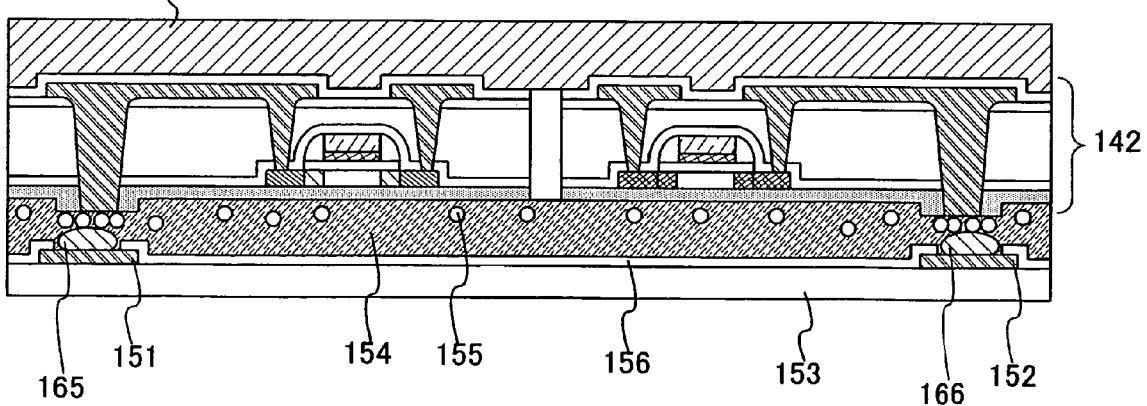

Note that the thin film integrated circuit 142 and the substrate 153 are attached by using the resin 154 containing the conductive particles 155 according to the above structure. However, the invention is not limited to this mode, and the thin film integrated circuit 142 and the substrate 153 may be attached by further using bumps (a protrusion-shaped conductive layer) 165 and 166 (see FIG. 6C). In this case, the conductive layers 151 and 152 over the substrate 153 are covered with a protective insulating layer 156. In addition, an opening is provided in part of the protective insulating layer 156.

Embodiment Mode 2

Figure 8A:
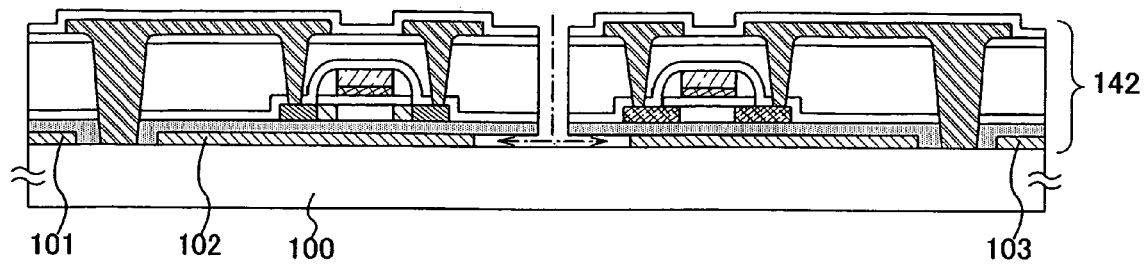
FIGS. 8A and 8B are views each explaining a method for manufacturing a semiconductor device according to a certain aspect of the present invention.
Figure 8B:
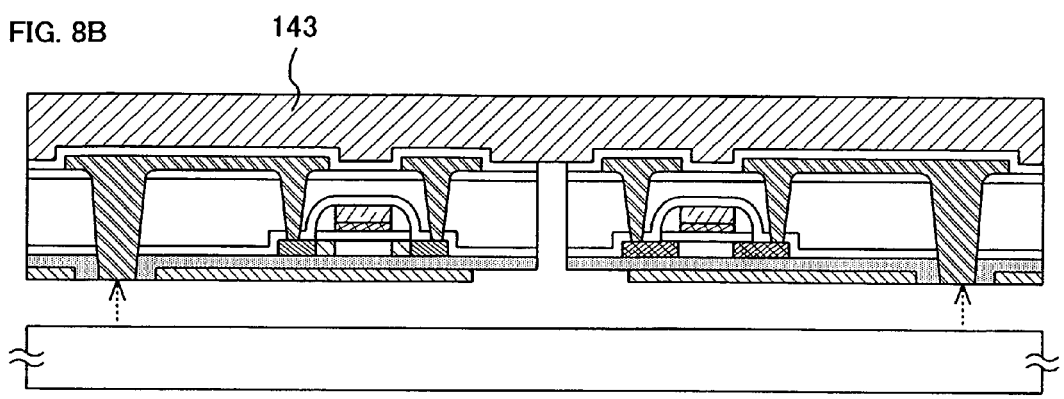

The peeling layers 101 to 103 are removed completely by etchant according to the above embodiment mode (see FIG. 4B). However, the present invention is not limited to this mode, and peeling layers 101 to 103 may be removed selectively by etchant (see FIG. 8A). Thereafter, after integrating the thin film integrated circuit 142 and the base material 143 by providing the base material 143 over the thin film integrated circuit 142, the thin film integrated circuit 142 and the base material 143 may be peeled from a substrate 100 by a physical means (see FIG. 8B). Also, the thin film integrated circuit 142 and the base material 143 may be peeled from a substrate 100 by a physical means without removing the peeling layers 101 to 103. When the thin film integrated circuit 142 is peeled from the substrate 100 by a physical means, there is the case where the peeling layers 101 to 103 are left over the substrate 100 and the case where the both peeling layers 101 to 103 and the thin film integrated circuit 142 are peeled from the substrate 100. This embodiment mode shows the latter case (see FIG. 8B). Note that a physical means corresponds to a means applying a stress externally, for example, a wind pressure of gas blown from a nozzle or an ultrasonic wave.

As mentioned above, the peeling layers 101 to 103 are removed within a short time by using a method for removing the peeling layers 101 to 103 selectively and jointly using a physical means instead of removing the peeling layers 101 to 103 completely by etchant; thus, the productivity can be improved.

Embodiment Mode 3

A method for manufacturing a semiconductor device according to the present invention briefly has a step of forming a thin film integrated circuit over a substrate, a step of peeling the thin film integrated circuit from the substrate, and a step of attaching the peeled thin film integrated circuit over a substrate. A conductive layer is provided over the substrate where the thin film integrated circuit is attached. This conductive layer functions as an antenna or just as a connection wiring. Hereinafter, various modes of a semiconductor device according to the invention will be explained.

Figures 16A, 16B:
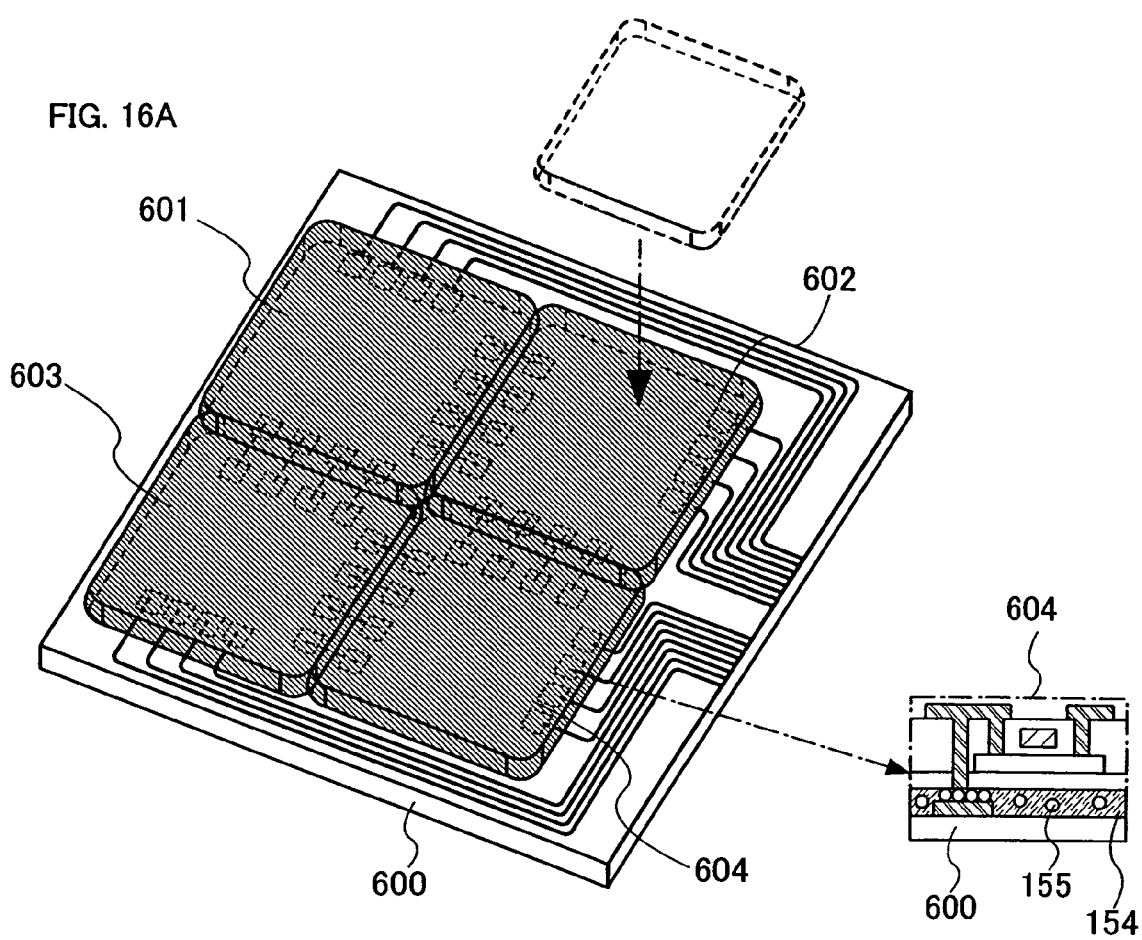
FIGS. 16A and 16B are views each explaining a semiconductor device according to a certain aspect of the present invention.

First, a semiconductor device in which a plurality of functions is integrated is explained (see FIGS. 16A and 16B). Plural thin film integrated circuits 601 to 604 are attached to the upper part of a substrate 600 provided with a conductive layer. The conductive layer over the substrate 600 and a connection conductive layer on the backside included in each of the thin film integrated circuits 601 to 604 are attached by a resin 154 containing conductive particles 155. Each of the thin film integrated circuits 601 to 604 functions as one or a plurality of Central Processing Unit (CPU), memory, a network processing circuit, a disk processing circuit, an image processing circuit, an audio processing circuit, a power supply circuit, a temperature sensor, a humidity sensor, an infrared sensor, and the like.

Figure 17A:
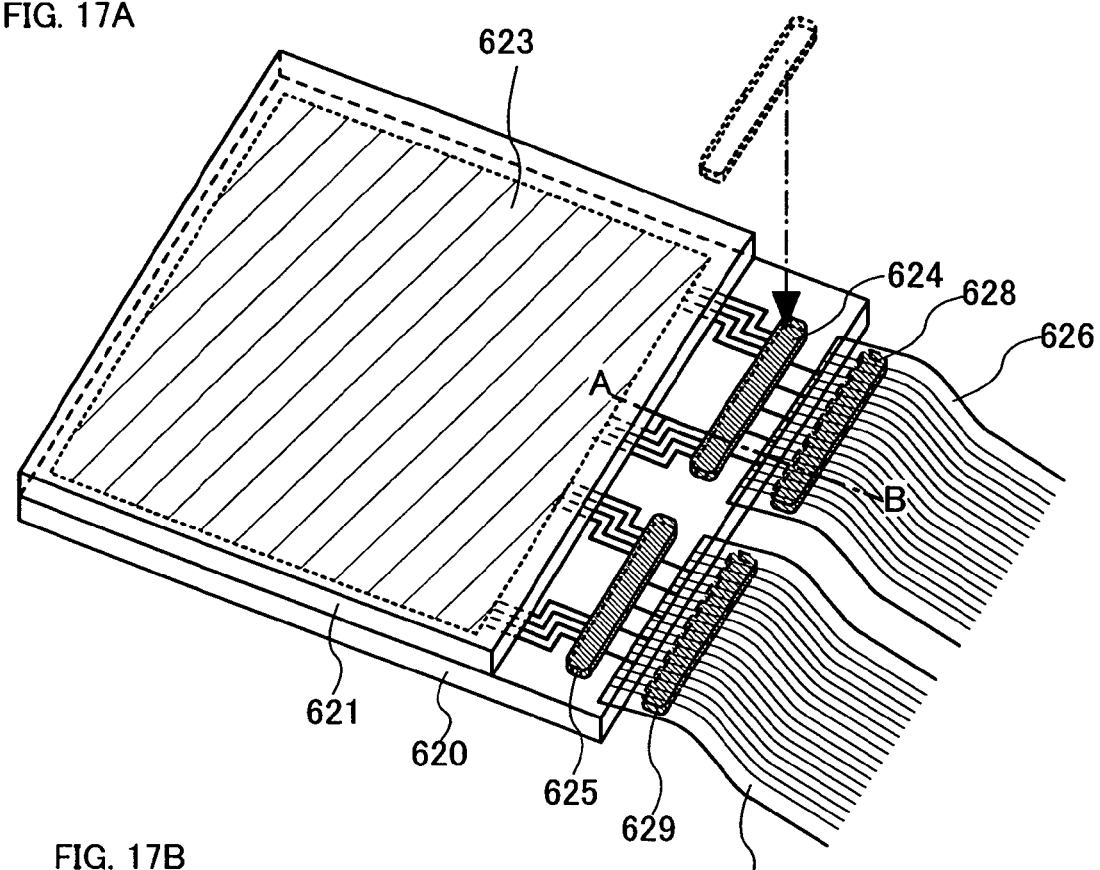
FIGS. 17A and 17B are views each explaining a semiconductor device according to a certain aspect of the present invention.
Figure 17B:
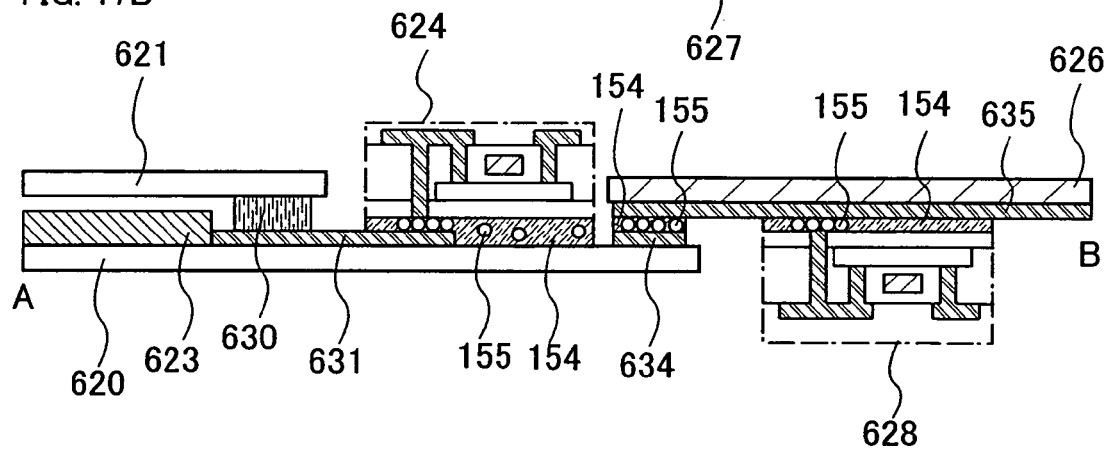

Next, a semiconductor device having a display portion is explained (see FIGS. 17A and 17B; A-B in FIG. 17A corresponds to A-B in FIG. 17B). Thin film integrated circuits 624 and 625 are attached to the upper part of a substrate 620, and thin film integrated circuits 628 and 629 are attached to the upper parts of connection films 626 and 627. A display portion 623 and the thin film integrated circuit 624 are in contact with each other through a conductive layer 631 over the substrate 620. The thin film integrated circuit 624 and the thin film integrated circuit 628 are in contact with each other through a conductive layer 634 over the substrate 620 and a conductive layer 635 over the connection film 627. A resin 154 containing conductive particles 155 is used to connect these conductive layers. The substrate 620 and an opposite substrate 621 are attached by a sealant 630.

Figure 18A:
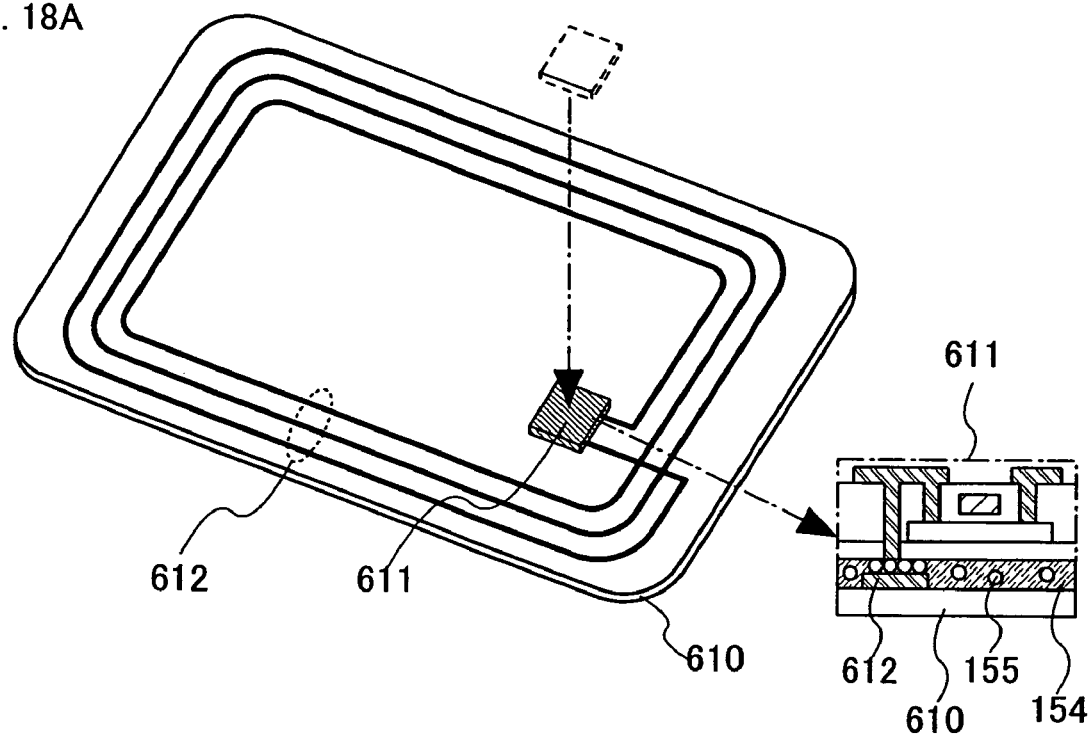
FIGS. 18A and 18B are views each explaining a semiconductor device according to a certain aspect of the present invention.
Figure 18B:
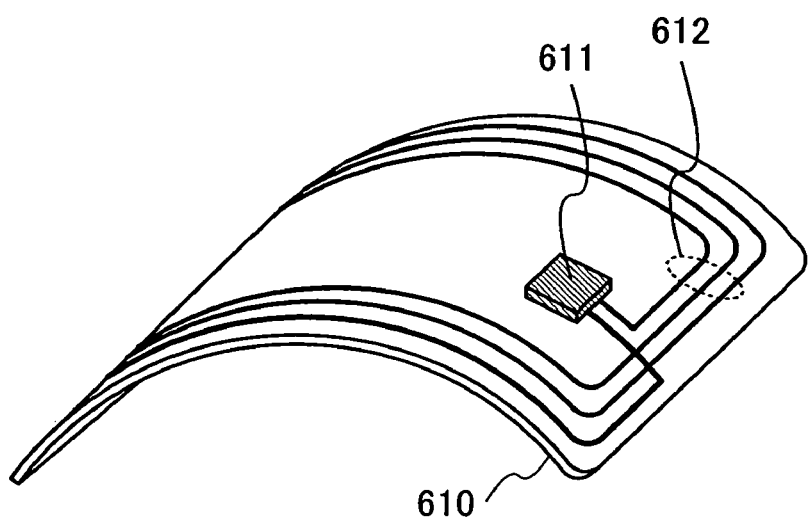

Then, a semiconductor device functioning as an IC card is explained (see FIGS. 18A and 18B). A thin film integrated circuit 611 is attached to the upper part of a substrate 610. A conductive layer 612 over the substrate 610 and a connection conductive layer on the backside of the thin film integrated circuit 611 are attached by a resin 154 containing conductive particles 155. Here, a thin and lightweight plastic substrate having flexibility is used for the substrate 610; therefore, it is possible to provide an IC card having flexibility with thin and lightweight value added.

Subsequently, a semiconductor device functioning as an IC card is explained (see FIG. 21A). Thin film integrated circuits 642 to 645 are attached to the upper part of a substrate 640. A conductive layer 641 over the substrate 640 and a connection conductive layer on the backside of the thin film integrated circuit 644 are attached by a resin 154 containing conductive particles 155. The thin film integrated circuits 642 to 645 each function as one or a plurality of a Central Processing Unit (CPU), a memory, a network processing circuit, a disk processing circuit, an image processing circuit, an audio processing circuit, a power supply circuit, a temperature sensor, a humidity sensor, an infrared sensor, and the like. A semiconductor device according to the invention having the above structure has the conductive layer 641 functioning as an antenna and has the plural thin film integrated circuits 642 to 645; therefore, a high-performance wireless chip can be provided. Thus, an IC card that enabled a complicated process such as cipher processing and that realized high performance can be provided.

Figure 21A:
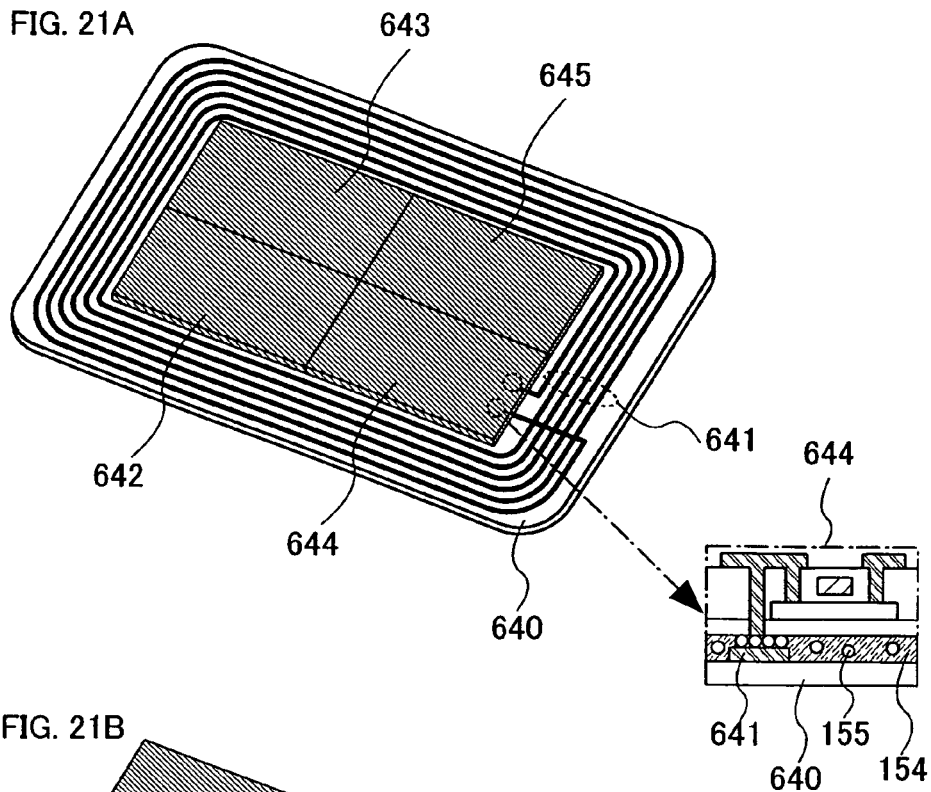
FIGS. 21A to 21C are views each explaining a semiconductor device according to a certain aspect of the present invention.

Note that, in a structure shown in FIG. 21A, the conductive layer 641 functioning as an antenna is provided in the periphery of the thin film integrated circuits 642 to 645. However, the invention is not limited to this mode. Thin film integrated circuits 642 to 645 may be provided to overlap with a conductive layer 641 functioning as an antenna (see FIGS. 21B and 21C). Accordingly, a wireless chip that is realized in downsizing, thinness, and lightweight can be provided by reducing the area of the substrate 640. In such a semiconductor device that realized downsizing, body temperature can be measured by, for example, applying a temperature sensor to any one of the thin film integrated circuits 642 to 645 to be attached to skin of a human body (preferably, skin of a forehead).

Figure 21B:
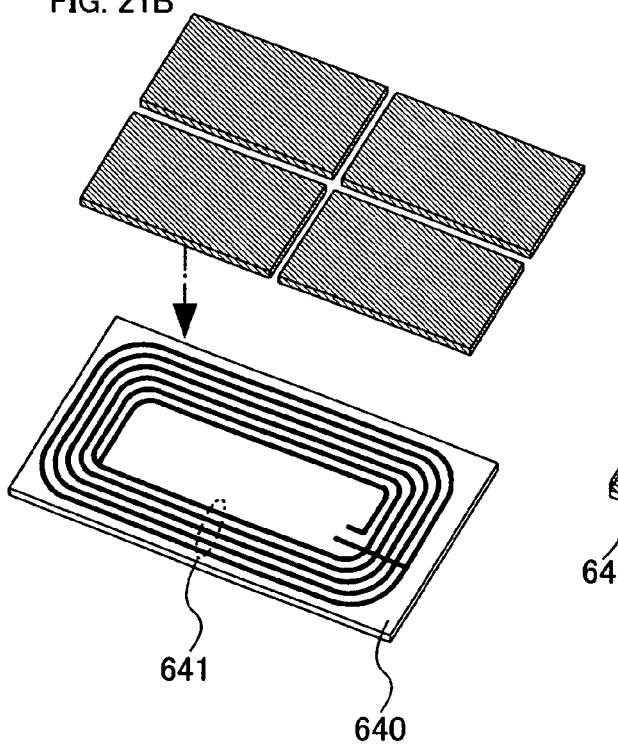
Figure 21C:
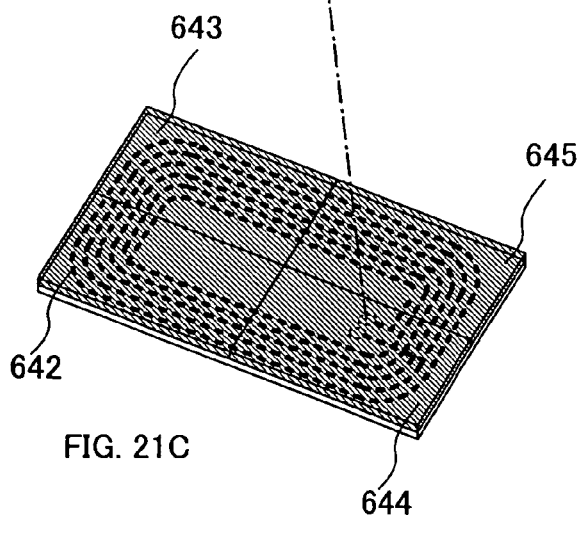

A thin film integrated circuit included in a semiconductor device according to the invention realizes downsizing, thinness, and lightweight and can realize further high performance and high added value by being applied to each of a semiconductor device including a plurality of systems (see FIGS. 16A and 16B), a semiconductor device having a display function (see FIGS. 17A and 17B), an IC card (see FIGS. 18A and 18B), an IC card (see FIG. 21A), and a wireless chip (see FIGS. 21B and 21C).

Embodiment 1

This embodiment will explain a method for forming a minute conductive layer. First, peeling layers 101 to 103, a base insulating layer 104, crystalline semiconductor layers 121 and 122, a gate insulating layer 105, and conductive layers 171 and 172 are formed over a substrate 100 having the insulating surface (see FIG. 9A). Next, resist masks 173 and 174 are formed over the conductive layers 171 and 172 by using a photomask. Subsequently, the resist masks 173 and 174 are etched by a known etching treatment such as oxygen plasma treatment to form new resist masks 175 and 176 (see FIG. 9B). The resist masks 175 and 176 through the above processes can be formed so minute that a limitation in which a resist mask can be formed by a photolithography method is exceeded.

Figure 9A:
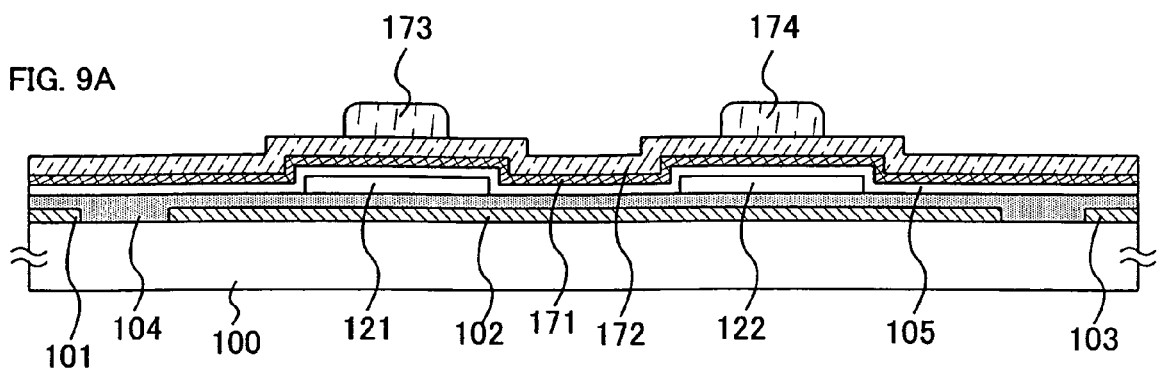
FIGS. 9A to 9C are views each explaining a method for manufacturing a semiconductor device according to a certain aspect of the present invention.
Figure 9B:
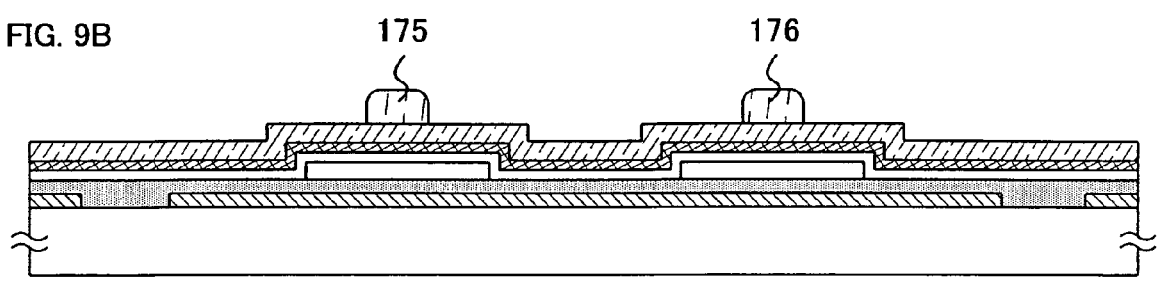
Figure 9C:
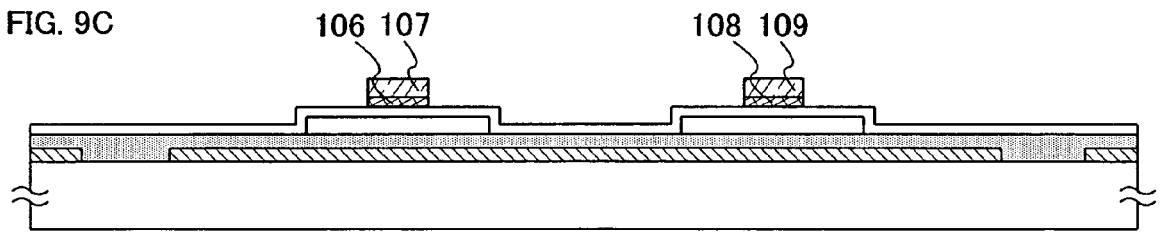

When etching treatment is performed by using the resist masks 175 and 176, minute conductive layers 106 to 109 can be manufactured (see FIG. 9C). The conductive layers 106 to 109 function as a gate electrode.

In addition, first, peeling layers 101 to 103, a base insulating layer 104, crystalline semiconductor layers 121 and 122, a gate insulating layer 105, conductive layers 171 and 172, and resist masks 173 and 174 are formed over a substrate 100 having the insulating surface (see FIG. 9A).

Figure 10A:
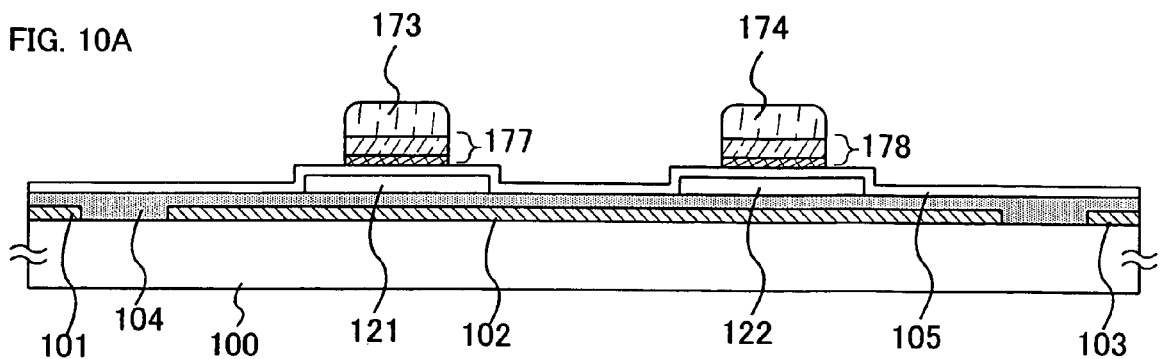
FIGS. 10A to 10C are views each explaining a method for manufacturing a semiconductor device according to a certain aspect of the present invention.
Figure 10B:
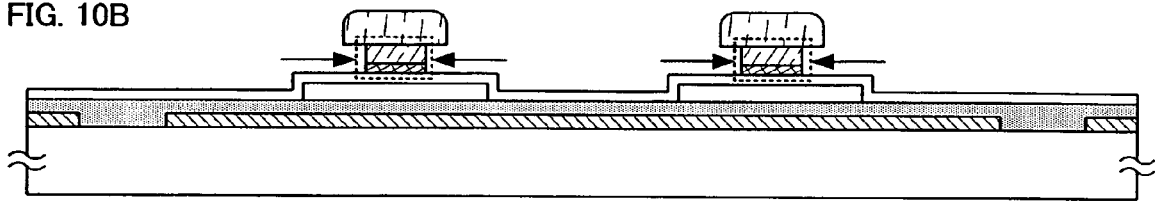
Figure 10C:
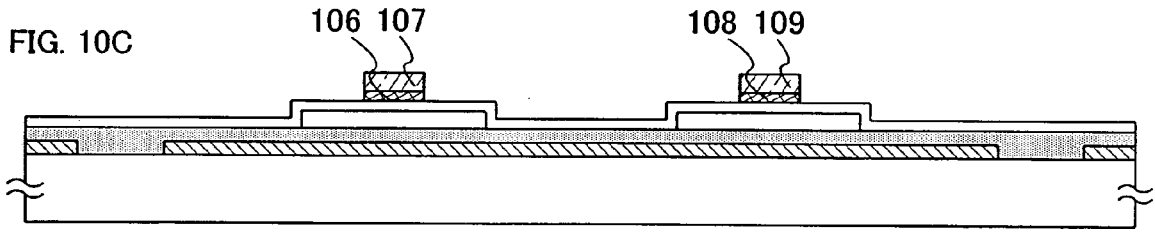

Next, conductive layers 177 and 178 are formed by etching the conductive layers 171 and 172 with the use of the resist masks 173 and 174 (see FIG. 10A). Subsequently, among the stacked layer body of the resist masks 173 and 174 and the conductive layers 177 and 178, only the side surfaces of the conductive layers 177 and 178 are etched selectively without removing the resist masks 173 and 174 (see FIG. 10B). Accordingly, as well as in the above method, conductive layers 106 to 109 can be formed so minute that a limitation in which a resist mask can be formed by a photolithography method is exceeded (see FIG. 10C). The conductive layers 106 to 109 function as a gate electrode.

A minute thin film transistor whose channel length is 0.5 μm or less can be formed by either of the above methods. As long as a thin film transistor is miniaturized, the thin film transistor can be highly integrated for the miniaturization; therefore, high performance is realized. In addition, since the width of a channel forming region is narrowed, a channel is soon generated and thus a high speed operation is realized.

Embodiment 2

In the case of using a semiconductor device according to the present invention as a wireless chip, the power supply of a wireless chip is supplied from an antenna; therefore, it is difficult to stabilize the power supply and it is necessary to control the power consumption as much as possible. If the power consumption increases, it is necessary to input an intense electromagnetic wave, which causes disadvantage that, for example, the power consumption of a reader/writer is increased, there is adverse effect on another device or a human body, or a communication distance between a wireless chip and a reader/writer is restricted.

Figure 11:
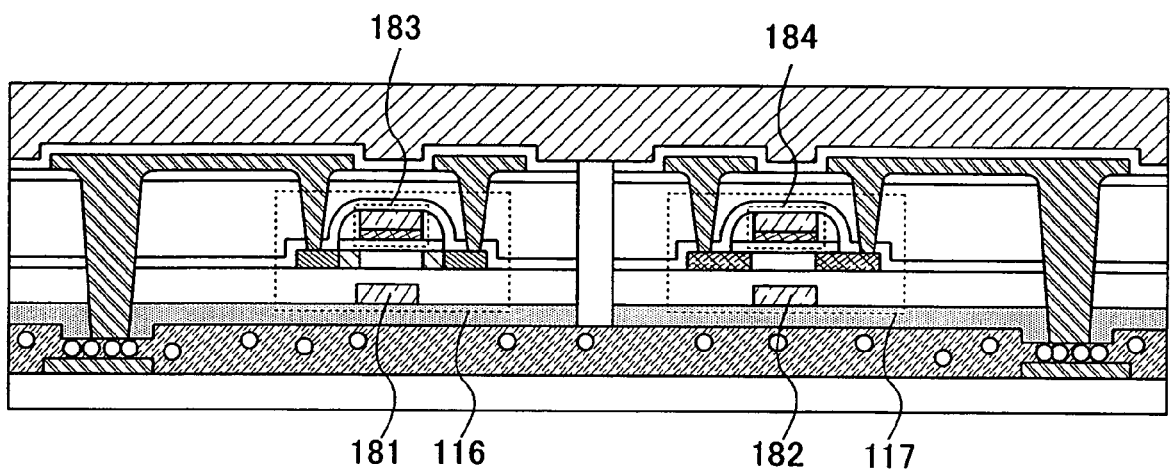
FIG. 11 is a view explaining a method for manufacturing a semiconductor device according to a certain aspect of the present invention.

Thus, the invention provides a semiconductor device having an n-type thin film transistor 116 including two gate electrodes of a conductive layer 181 functioning as a bottom gate electrode and a conductive layer 183 functioning as a top gate electrode and a p-type thin film transistor 117 including two gate electrodes of a conductive layer 182 functioning as a bottom gate electrode and a conductive layer 184 functioning as a top gate electrode (see FIG. 11). A method for applying a bias voltage to the conductive layers 181 and 182 functioning as a bottom gate electrode is effective in order to control the power consumption. More specifically, applying negative bias voltage to the conductive layer 181 of the n-type thin film transistor 116 functioning as a bottom gate electrode enables the threshold voltage to increase and the leakage current to reduce. In addition, applying positive bias voltage enables the threshold voltage to decrease and current to flow easily in a channel forming region. Therefore, the thin film transistor 116 is operated at higher speed or at lower voltage. On the other hand, applying positive bias voltage to the conductive layer 182 of the p-type thin film transistor 117 functioning as a bottom gate electrode enables the threshold voltage to increase and the leakage current to reduce. In addition, applying negative bias voltage enables the threshold voltage to decrease and current to flow easily in a channel forming region. Therefore, the thin film transistor 117 is operated at higher speed or at lower voltage.

As mentioned above, the threshold voltage of the thin film transistors 116 and 117 is changed and the leakage current thereof is reduced by controlling the bias voltage applied to the bottom gate electrodes, and as a result, the power consumption of a semiconductor devise itself can be controlled. Therefore, even when a complicated process such as cipher processing is performed, stabilization of the power supply is realized without destabilization of the power supply. Further, there is no necessity to input an intense electromagnetic wave; thus, the communication distance with a reader/writer can be improved. Note that it is desirable to apply the bias voltage to the thin film transistors 116 and 117 by providing a special control circuit and controlling the application of the bias voltage by the control circuit.

Embodiment 3

Figure 12A:
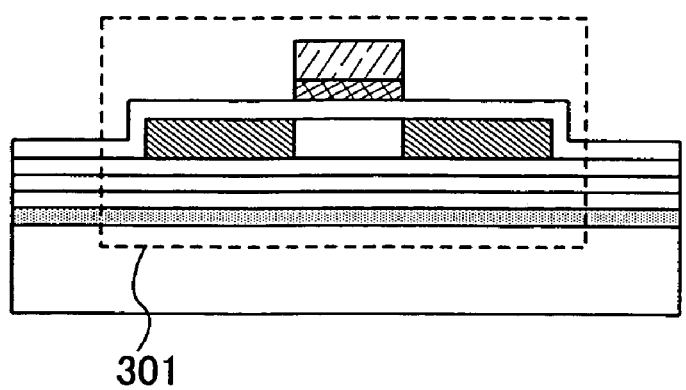
FIGS. 12A to 12D are views each explaining a method for manufacturing a semiconductor device according to a certain aspect of the present invention.
Figure 12B:
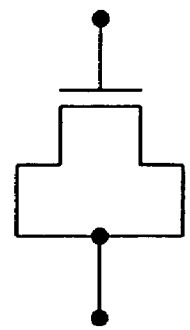

This embodiment will explain the cross-sectional structure of a capacitor transistor used for a semiconductor device according to the present invention (see FIG. 12A). The source and drain electrodes of a capacitor transistor 301 are connected to each other, and when the capacitor transistor 301 is turned ON, a capacitor is formed between the gate electrode and the channel forming region. Such a cross-sectional structure of the capacitor transistor 301 is the same as the cross-sectional structure of a usual thin film transistor. The equivalent circuit diagram can be shown as in FIG. 12B.

Figure 12C:
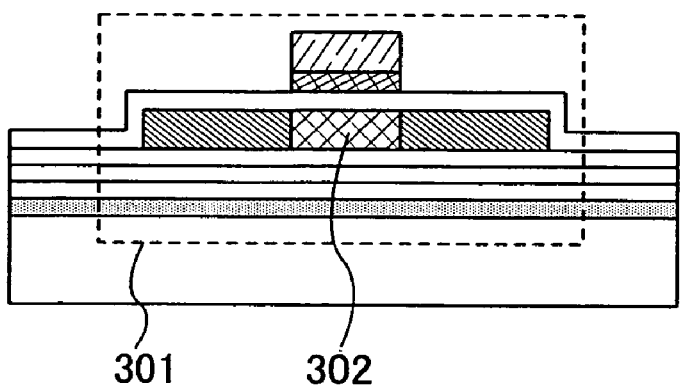
Figure 12D:
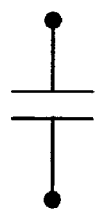

However, since a gate insulating film is used to form a capacitor in the above structure, the capacitance is influenced due to the fluctuation of the threshold voltage of the capacitor transistor 301. Therefore, a capacitor transistor 301 in which a region 302 overlapped with the gate electrode is added with an impurity element may be used (see FIG. 12C). In the capacitor transistor 301 having the above structure, the capacitor is formed regardless of the threshold voltage of the transistor; therefore, the influence due to the fluctuation of the threshold voltage of the transistor can be prevented. The equivalent circuit diagram in this case can be shown as in FIG. 12D.

Embodiment 4

This embodiment will explain the structure when a semiconductor device according to the present invention is used as a wireless chip with reference to the drawings. The specification of a wireless chip explained here meets ISO standards of 15693, which is a vicinity type and whose communication signal frequency is 13.56 MHz. In addition, the reception responds only to a data readout instruction, the data transmission rate of the transmission is approximately 13 kHz, and a Manchester code is used for a data coded form.

Figure 13:
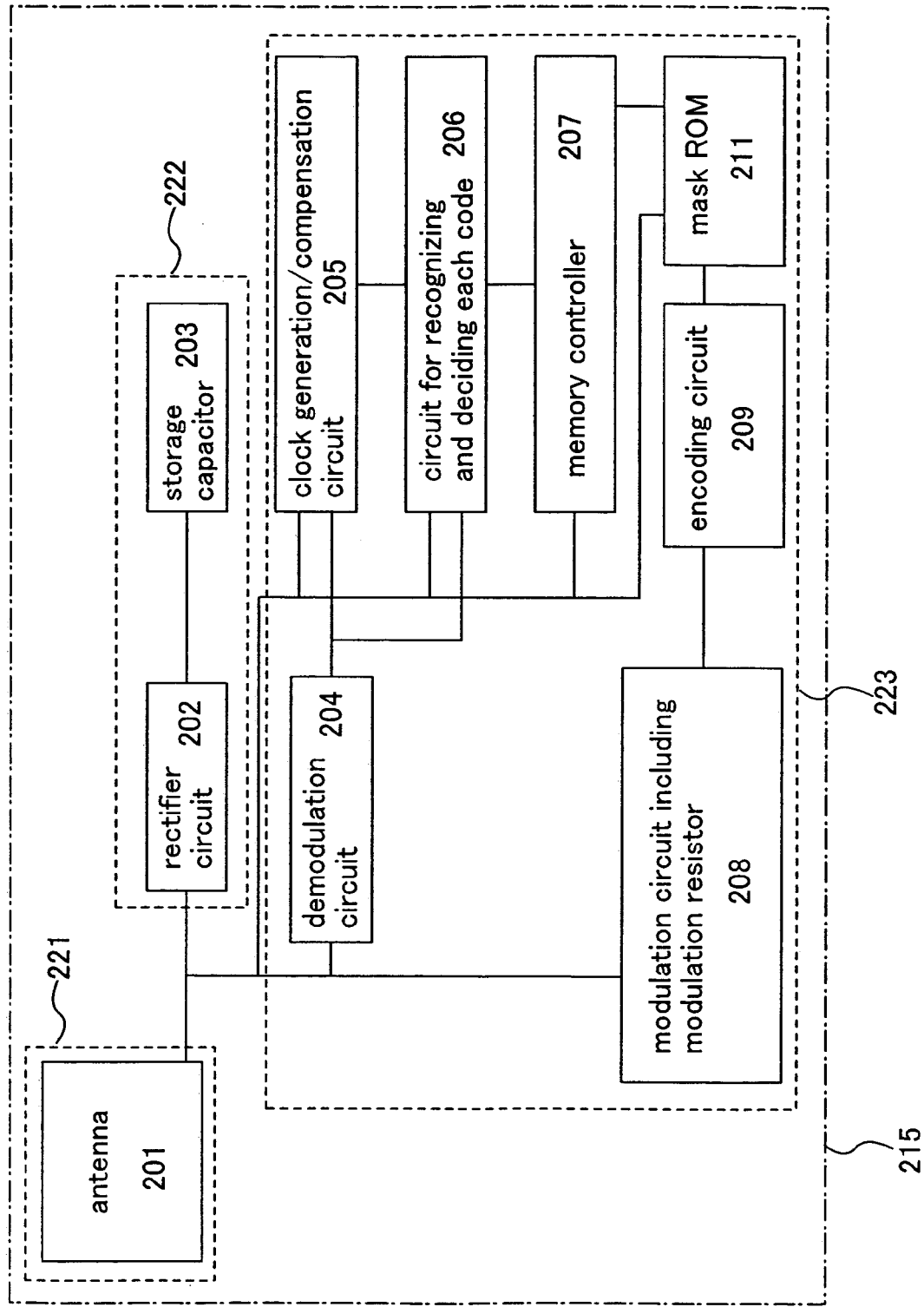
FIG. 13 is a view explaining a semiconductor device according to a certain aspect of the present invention.

The wireless chip roughly includes an antenna portion 221, a power supply portion 222, and a logic portion 223. The antenna portion 221 includes an antenna 201 for receiving an external signal and transmitting data (see FIG. 13).

The power supply portion 222 includes a rectifier circuit 202 that creates a power supply by a signal externally received via the antenna 201 and a storage capacitor 203 for storing the created power supply.

The logic portion 223 includes a demodulation circuit 204 that demodulates a received signal, a clock generation/compensation circuit 205 that generates a clock signal, a circuit for recognizing and deciding each code 206, a memory controller 207 that creates a signal for reading out data from memory by a received signal, a modulation circuit including a modulation resistor 208 that modulate an encoded signal to a transmitted signal, an encoding circuit 209 that encodes a read out data, and a mask ROM 211 that holds data.

A code recognized and decided by the circuit for recognizing and deciding each code 206 is an end of frame (EOF), a start of frame (SOF), a flag, a command code, a mask length, a mask value, or the like. In addition, the circuit for recognizing and deciding each code 206 also includes cyclic redundancy check (CRC) function that identifies a transmission error.

Note that not only the mask ROM 211 but also one or a plurality of DRAM (Dynamic Random Access Memory), SRAM (Static Random Access Memory), FeRAM (Ferroelectric Random Access Memory), PROM (Programmable Read Only Memory), EPROM (Electrically Programmable Read Only Memory), EEPROM (Electrically Erasable Read Only Memory), and flash memory may also be used as a means for holding data.

Next, one example of the layout of a wireless chip having the above structure is explained with reference to FIGS. 14A and 14B. First, a layout of one wireless chip is explained (see FIG. 14A). In the wireless chip, a base material 216 provided with a conductive layer functioning as an antenna 201 is attached to an element group 214 including the power supply portion 222 and the logic portion 223. Part of the region where the element group 214 is formed is overlapped with part of the region where the antenna 201 is formed.

Figure 14A:
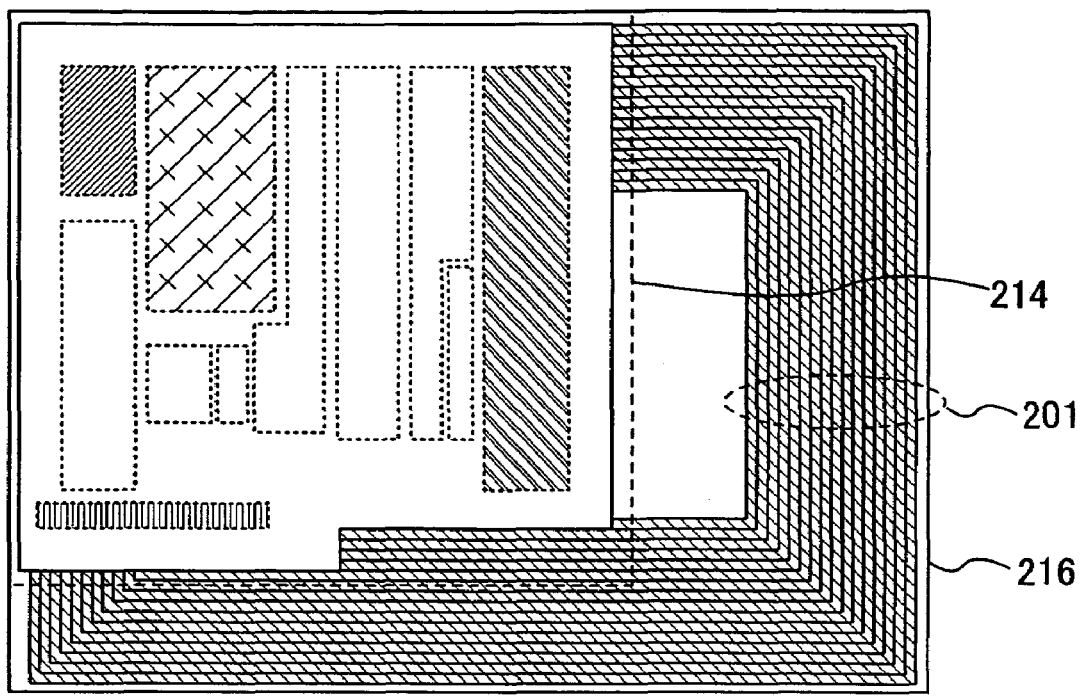
FIGS. 14A and 14B are views each explaining a semiconductor device according to a certain aspect of the present invention.
Figure 14B:
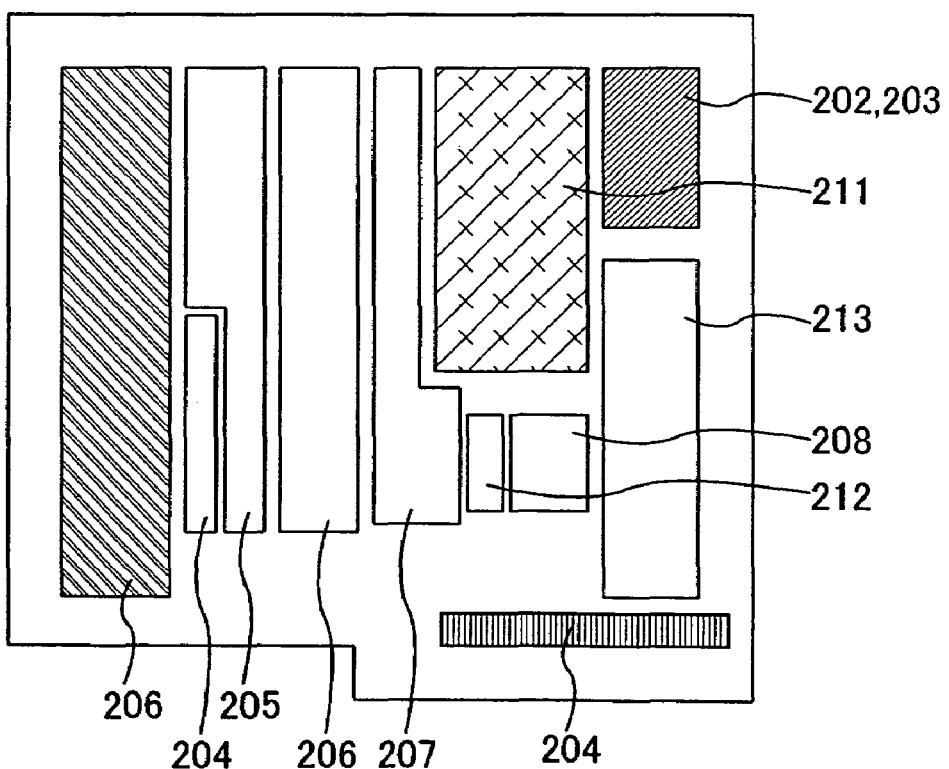

In the structure shown in FIG. 14A, it is designed so that the width of wirings that form the antenna 201 is 150 μm, the width between the wirings is 10 μm, and the number of windings is 15.

Figure 15A:
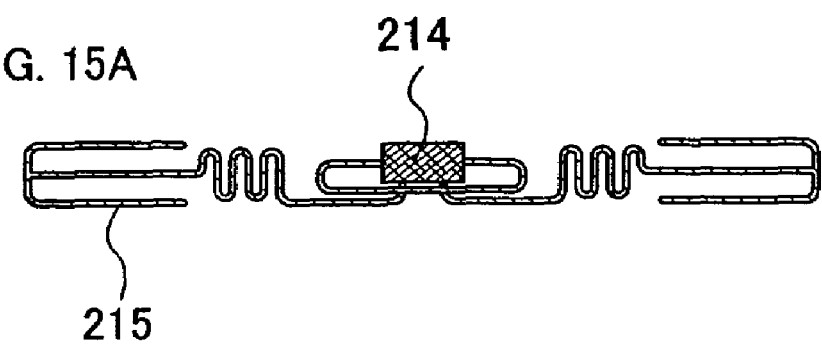
FIGS. 15A and 15B are views each explaining a semiconductor device according to a certain aspect of the present invention.
Figure 15B:
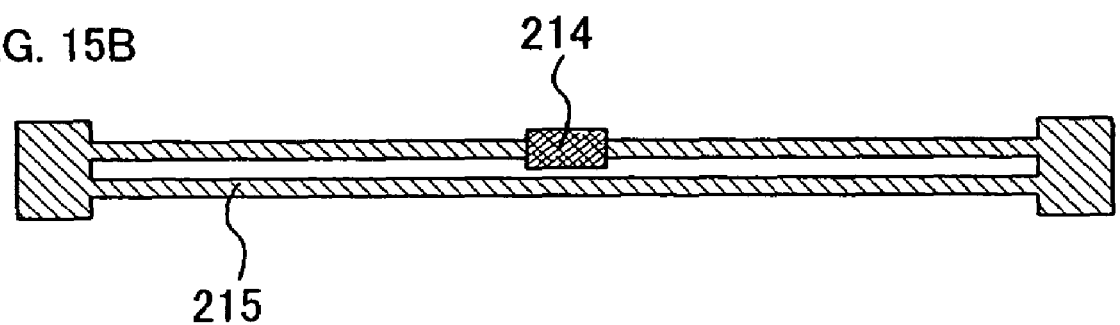

Note that the antenna 201 is not limited to a winding shape as shown in FIG. 14A. The shape of the antenna 201 may be any one of shapes of a curve type (see FIG. 15A) or a linear type (see FIG. 15B).

Subsequently, the layouts of the power supply portion 222 and the logic portion 223 are explained (see FIG. 14B). The rectifier circuit 202 and the storage capacitor 203 included in the power supply portion 222 are provided in the same region. The demodulation circuit 204 and the circuit for recognizing and deciding each code 206 included in the logic portion 223 are provided separately in two places. The mask ROM 211 and the memory controller 207 are provided adjacently. The clock generation/compensation circuit 205 and the circuit for recognizing and deciding each code 206 are provided adjacently. The demodulation circuit 204 is provided between the clock generation/compensation circuit 205 and the circuit for recognizing and deciding each code 206. In addition, although not shown in the block diagram of FIG. 13, a detection capacitor for a logic portion 212 and a detection capacitor for a power supply portion 213 are provided. The modulation circuit including a modulation resistor 208 is provided between the detection capacitors 212 and 213.

The mask ROM 211 is a memory in which memory contents are created in the manufacturing process. Here, two power supply lines of a power supply line connected to a high-potential power supply (also referred to as VDD) and a power supply line connected to a low-potential power supply (also referred to as VSS) are provided, and whether a transistor included in each memory cell is connected to either of the above power supply lines determines the memory content stored by a memory cell.

As for the wave band of an electric wave used by a semiconductor device according to the invention, there are such as a long wave band up to 135 kHz; a short wave band of 6.78 MHz, 13.56 MHz, 27.125 MHz, 40.68 MHz, and 5.0 MHz; and a micro wave band of 2.45 GHz, 5.8 GHz, and 24.125 GHz, and any one of wave band may be applied. In addition, an electromagnetic wave is propagated by applying either an electromagnetic induction type or a radio frequency communication type.

Embodiment 5

Figure 19A:
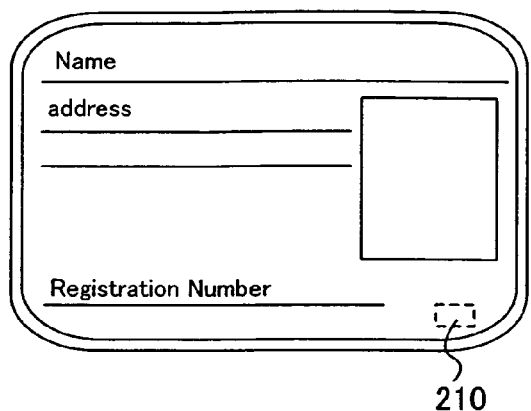
FIGS. 19A to 19E are views each explaining usage patterns of a semiconductor device according to a certain aspect of the present invention.
Figure 19B:
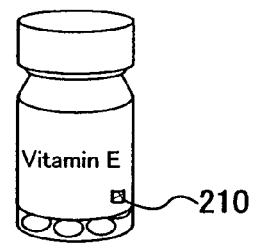
Figure 19C:
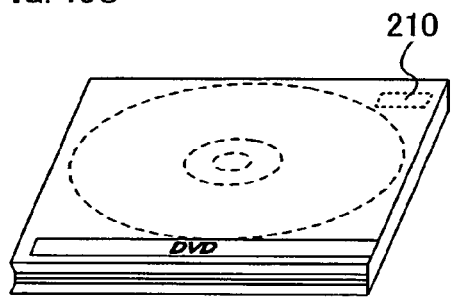
Figure 19D:
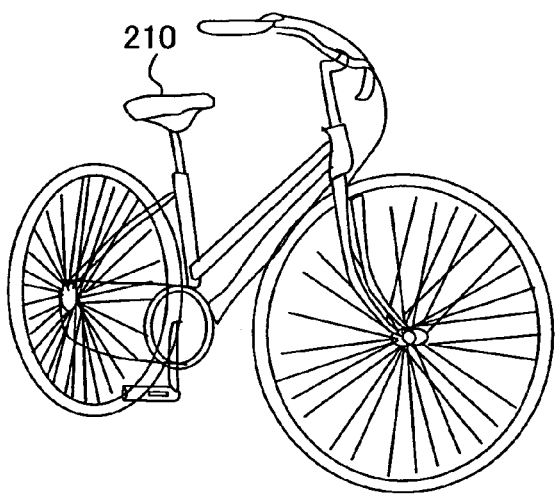
Figure 19E:
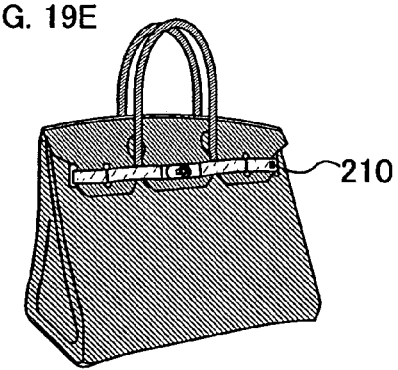

The application of a semiconductor device according to the present invention ranges extensively and its specific example will be explained hereinafter. A semiconductor device 210 according to the invention can be put to practical use by being provided to an article, for example, a bill, a coin, securities, bearer bonds, or certificates (a driver's license, a residence certificate, or the like; see FIG. 19A), wrapping items (wrapping paper, a bottle, or the like; see FIG. 19B), a recording medium (DVD software, a video tape, or the like; see FIG. 19C), vehicles (a bicycle or the like; see FIG. 19D), accessories (a bag, glasses, or the like; see FIG. 19E), foodstuffs, clothes, living wares, electronic devices, or the like. An electronic device is a liquid crystal display device, an EL display device, a television device (also merely referred to as a television or a television receiver), a cellular phone, or the like.

A semiconductor device according to the invention is fixed to articles by being attached to the surface thereof or mounted thereon. For example, a semiconductor device according to the invention is fixed to each article by being mounted on the base paper of a book cover and on organic resin of a package made therefrom. Since a semiconductor device according to the invention realizes downsizing, thinness, and lightweight, design of the article itself is not impaired even after fixing the semiconductor device to articles.

In addition, an authentication function can be supplied by providing a semiconductor device according to the invention for a bill, a coin, securities, bearer bonds, or certificates, for example. Forgery can be prevented with the use of this authentication function. In addition, the efficiency of a system such as an inspection system can be promoted by providing a semiconductor device according to the invention for wrapping items, a recording medium, a personal item, foodstuffs, clothes, a living ware, an electronic device, or the like.

Figure 20A:
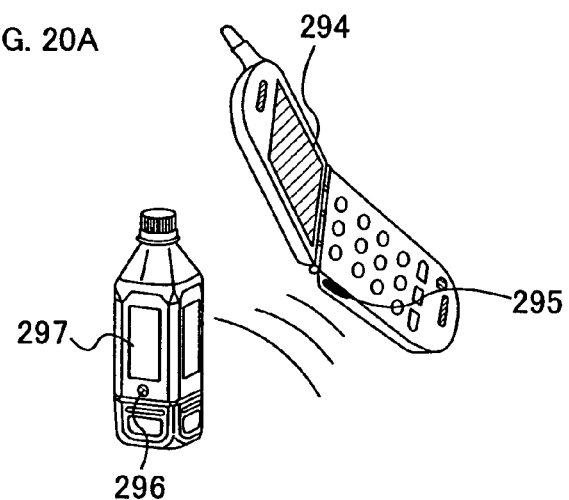
FIGS. 20A and 20B are views each explaining usage patterns of a semiconductor device according to a certain aspect of the present invention.
Figure 20B:
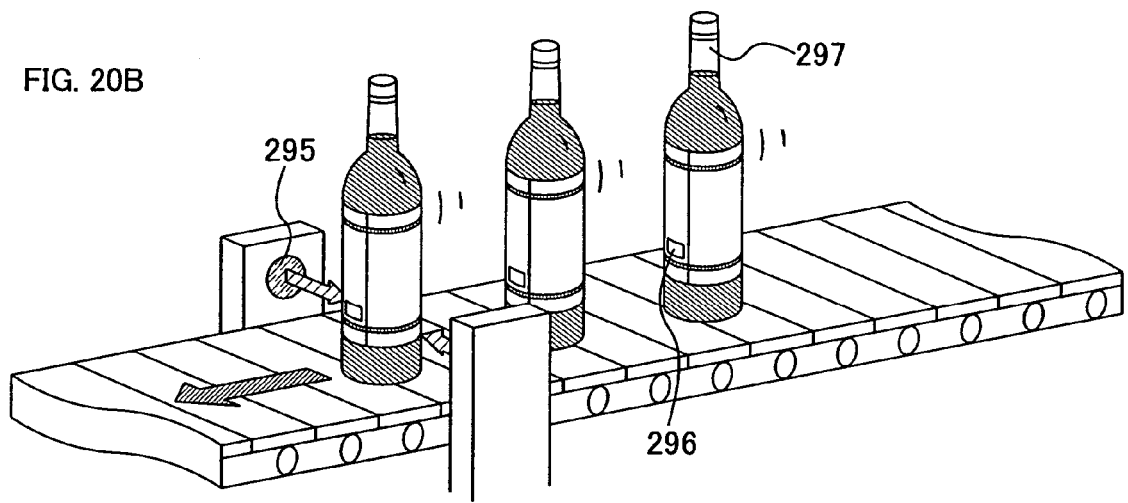

Next explains an example of a system in which a semiconductor device according to the invention is used. First, a reader/writer 295 is provided on the side surface of a portable terminal including a display portion 294 and a semiconductor device 296 is provided on the side surface of an article 297 (see FIG. 20A). In addition, information of the article 297 on raw materials, origins, records of a distribution process, or the like is stored in the semiconductor device 296 in advance. Then, if the information included in the semiconductor device 296 is made to display in the display portion 294 simultaneously with holding the semiconductor device 296 over the reader/writer 295, a system superior in convenience can be provided. In addition, as another example, the reader/writer 295 is provided on the side of a belt conveyor (see FIG. 20B). Accordingly, a system capable of inspecting the article 297 easily can be provided. The high performance of a system can be promoted and the convenience thereof can be improved by using a semiconductor device according to the invention for a system for controlling an article or a distribution system.

The present application is based on Japanese Patent Application serial No. 2004-277533 filed on Sep. 24, 2004 in Japanese Patent Office, the contents of which are hereby incorporated by reference.

What is claimed is:

1. A method for manufacturing a semiconductor device comprising the steps of:
   forming a peeling layer selectively over a first substrate wherein a portion of said first substrate is not covered by said peeling layer;
   forming a first insulating layer over said peeling layer and said portion of the first substrate;
   forming a thin film transistor including at least a source region and a drain region over the insulating layer;
   forming a second insulating layer over the first insulating layer and the thin film transistor;
   forming a first opening in the first insulating layer and the second insulating layer for exposing a part of the first substrate;
   forming a second opening in the second insulating layer for exposing one of the source region and the drain region of the thin film transistor;
   forming a first conductive layer over the second insulating layer, wherein the first conductive layer fills the first opening and the second opening;
   forming a third opening in the first insulating layer and the second insulating layer for exposing the peeling layer;
   introducing etchant to the third opening for removing the peeling layer;
   peeling a stacked body including at least the thin film transistor, the second insulating layer and the first conductive layer from the first substrate; and
   attaching the stacked body to a second substrate so that the first conductive layer is electrically connected to a second conductive layer provided over the second substrate.

2. The method for manufacturing a semiconductor device according to claim 1, wherein the first substrate is any one of a glass substrate and a quartz substrate.

3. The method for manufacturing a semiconductor device according to claim 1, wherein the peeling layer comprises any one of tungsten and molybdenum.

4. The method for manufacturing a semiconductor device according to claim 1, wherein the peeling layer comprises any one of tungsten oxide and molybdenum oxide formed by a sputtering method in an oxygen atmosphere.

5. The method for manufacturing a semiconductor device according to claim 1, wherein the peeling layer comprises any one of tungsten and molybdenum and the first insulating layer comprises silicon oxide.

6. The method for manufacturing a semiconductor device according to claim 1, wherein the etchant is a gas containing halogen fluoride or a liquid containing halogen fluoride.

7. A method for manufacturing a semiconductor device comprising the steps of:
   forming a peeling layer selectively over a first substrate wherein a portion of said first substrate is not covered by said peeling layer;
   forming a first insulating layer over said peeling layer and said portion of the first substrate;
   forming a thin film transistor including at least a source region and a drain region over the insulating layer;
   forming a second insulating layer over the first insulating layer and the thin film transistor;

forming a first opening in the first insulating layer and the second insulating layer for exposing a part of the first substrate;

forming a second opening in the second insulating film for exposing one of the source region and the drain region of the thin film transistor;

forming a first conductive layer over the second insulating layer wherein the first conductive layer fills the first opening and the second opening;

forming a third opening in the first insulating layer and the second insulating layer for exposing the peeling layer;

introducing etchant to the third opening for selectively removing the peeling layer;

peeling a stacked body including at least the thin film transistor, the second insulating layer and the first conductive layer from the first substrate by using a physical means; and attaching the stacked body to a second substrate so that the first conductive layer is electrically connected to a second conductive layer provided over the second substrate.

8. The method for manufacturing a semiconductor device according to claim 7, wherein the first substrate is any one of a glass substrate and a quartz substrate.

9. The method for manufacturing a semiconductor device according to claim 7, wherein the peeling layer comprises any one of tungsten and molybdenum.

10. The method for manufacturing a semiconductor device according to claim 7, wherein the peeling layer comprises any one of tungsten oxide and molybdenum oxide formed by a sputtering method in an oxygen atmosphere.

11. The method for manufacturing a semiconductor device according to claim 7, wherein the peeling layer comprises any one of tungsten and molybdenum and the first insulating layer comprises silicon oxide.

12. The method for manufacturing a semiconductor device according to claim 7, wherein the etchant is a gas containing halogen fluoride or a liquid containing halogen fluoride.

13. A method for manufacturing a semiconductor device comprising the steps of:

forming a peeling layer selectively over a first substrate wherein a portion of said first substrate is not covered by said peeling layer;

forming a first insulating layer over said peeling layer and said portion of the first substrate;

forming a thin film transistor including at least a source region and a drain region over the insulating layer;

forming a second insulating layer over the first insulating layer and the thin film transistor;

forming a first opening in the first insulating layer and the second insulating layer for exposing a part of the first substrate;

forming a second opening in the second insulating layer for exposing one of the source region and the drain region of the thin film transistor;

forming a first conductive layer over the second insulating layer, wherein the first conductive layer fills the first opening and the second opening;

peeling a stacked body including at least the thin film transistor, the second insulating layer and the first conductive layer from the first substrate; and attaching the stacked body to a second substrate so that the first conductive layer is electrically connected to a second conductive layer provided over the second substrate.

14. The method for manufacturing a semiconductor device according to claim 13, wherein the first substrate is any one of a glass substrate and a quartz substrate.

15. The method for manufacturing a semiconductor device according to claim 13, wherein the peeling layer comprises any one of tungsten and molybdenum.

16. The method for manufacturing a semiconductor device according to claim 13, wherein the peeling layer comprises any one of tungsten oxide and molybdenum oxide formed by a sputtering method in an oxygen atmosphere.

17. The method for manufacturing a semiconductor device according to claim 13, wherein the peeling layer comprises any one of tungsten and molybdenum and the first insulating layer comprises silicon oxide.

* * * * *